United States Patent
Chen et al.

(10) Patent No.: US 11,392,246 B2
(45) Date of Patent: Jul. 19, 2022

(54) METHOD FOR DRIVING TOUCH-AND-DISPLAY DEVICE, DRIVING CIRCUIT, AND TOUCH-AND-DISPLAY DEVICE

(71) Applicant: NOVATEK MICROELECTRONICS CORP., Hsinchu (TW)

(72) Inventors: Chun-Hung Chen, Taipei (TW); Kai-Wen Shao, Hsinchu (TW); Feng-Lin Chan, Zhubei (TW); Shuo-Wen Jang, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/313,818

(22) Filed: May 6, 2021

(65) Prior Publication Data

US 2021/0349601 A1    Nov. 11, 2021

Related U.S. Application Data

(60) Provisional application No. 63/021,663, filed on May 7, 2020.

(51) Int. Cl.
*G06F 3/041*    (2006.01)
*G09G 3/3233*    (2016.01)
(Continued)

(52) U.S. Cl.
CPC .......... *G06F 3/04184* (2019.05); *G06F 3/044* (2013.01); *G09G 3/3208* (2013.01);
(Continued)

(58) Field of Classification Search
CPC ................ G06F 3/04184; G06F 3/044; G09G 3/3208; G09G 3/3233; G09G 2310/0202;
(Continued)

(56) References Cited

U.S. PATENT DOCUMENTS 9,442,615 B2    9/2016 Reynolds
9,519,377 B2    12/2016 Ji
(Continued)

FOREIGN PATENT DOCUMENTS

CN    106323633 A    1/2017
CN    106339128 A    1/2017
(Continued)

OTHER PUBLICATIONS

Notice of Allowance, U.S. Appl. No. 17/313,810, dated Jan. 31, 2022.
(Continued)

*Primary Examiner* — Chanh D Nguyen
*Assistant Examiner* — Ngan T. Pham-Lu
(74) *Attorney, Agent, or Firm* — Marshall, Gerstein & Borun LLP

(57) ABSTRACT

The disclosure provides a method for driving an OLED touch-and-display device, a driving circuit, and the OLED touch-and-display device. The method includes: dividing each display frame into at least one display period and at least one touch detection period which are alternated; during each display period, generating sequentially-shifted gate driving signals and sequentially-shifted light-emission control signals, and sequentially applying them to at least a part of gate driving lines of the plurality and corresponding light-emission control lines; during each touch detection period: suspending the generation of gate driving signals or also suspending the generation of light-emission control signals; adjusting the average display luminance of a plurality of rows of pixels within a predetermined time period, so that the display luminance is uniform, and the gate driving signal for each row of pixels and the light-emission control signal of the light-emission control line maintain a preset timing relationship.

18 Claims, 15 Drawing Sheets

(51) Int. Cl.
*G06F 3/044* (2006.01)
*G09G 3/3208* (2016.01)

(52) U.S. Cl.
CPC ... *G09G 3/3233* (2013.01); *G09G 2310/0202* (2013.01); *G09G 2310/0243* (2013.01); *G09G 2310/08* (2013.01); *G09G 2320/0233* (2013.01)

(58) Field of Classification Search
CPC ....... G09G 2310/0243; G09G 2310/08; G09G 2320/0233
See application file for complete search history.

(56) References Cited

U.S. PATENT DOCUMENTS

| | | | |
|---|---|---|---|
| 9,640,121 | B2 | 5/2017 | Munechika |
| 2015/0221255 | A1 | 8/2015 | Qing et al. |
| 2015/0279276 | A1 | 10/2015 | Xu |
| 2015/0364083 | A1* | 12/2015 | Jeon ..................... G09G 3/3233 345/76 |
| 2018/0239488 | A1 | 8/2018 | Lin et al. |
| 2018/0350286 | A1* | 12/2018 | Lee ..................... G09G 3/3225 |
| 2019/0025965 | A1* | 1/2019 | Yang ..................... G09G 3/32 |
| 2019/0220645 | A1 | 7/2019 | Ding et al. |

FOREIGN PATENT DOCUMENTS

| | | |
|---|---|---|
| CN | 107885400 A | 4/2018 |
| CN | 108459755 A | 8/2018 |
| CN | 106601173 B | 12/2019 |
| TW | 201220265 A | 5/2012 |

OTHER PUBLICATIONS

Non-final Office Action, U.S. Appl. No. 17/313,796, dated Apr. 25, 2022.

* cited by examiner adjusting average display luminance of the plurality of rows of pixels within a predetermined time period, so that a deviation among a plurality of average display luminance values of the plurality of rows of pixels is less than a predetermined threshold within the predetermined time period, evenly distributing the plurality of rows of pixels of the display panel in a plurality of TPs, so that a deviation among a plurality of total light-emission time lengths of the plurality of rows of pixels within the predetermined time period is less than a predetermined time length threshold

OR within the predetermined time period, prohibiting the plurality of rows of pixels from emitting light during the TPs, so that the deviation among a plurality of total light-emission time lengths of the plurality of rows of pixels within the predetermined period is less than a predetermined time length threshold

OR

S640-1 — determining a total time length of the display frame

S640-2 — determining a time length for which a light-emission control signal applied to each light-emission control line maintains at inactive level S640-3 — adjusting display data for at least one row of pixels corresponding to at least one light-emission control line according to a ratio, based on the time length for which the light-emission control signal applied to each light-emission control line maintains at inactive level and the total time length of the display frame, wherein light-emission control signals applied to the at least one light-emission control line are at inactive level when each touch detection period starts

FIG. 6B

METHOD FOR DRIVING TOUCH-AND-DISPLAY DEVICE, DRIVING CIRCUIT, AND TOUCH-AND-DISPLAY DEVICE

CROSS-REFERENCE TO RELATED APPLICATION

This application is based on and claims priority to U.S. provisional Application No. 63/021,663 filed on May 7, 2020 in the United States Patent and Trademark Office, the disclosure of which is incorporated by reference herein in its entirety.

TECHNICAL FIELD

The disclosure relates to a technical field of touch screens, and in particular to a method for driving a touch-and-display device, a driving circuit and a touch-and-display device.

BACKGROUND

In recent years, technologies of touch sensing have developed rapidly, and many consumer electronic products such as mobile phones, satellite navigation systems, tablet computers, personal digital assistants (PDA) and notebook computers have built-in touch functions. In the above-mentioned various electronic products, the region of the display panel is endowed with touch sensing function, that is, a display panel with simple display function is designed into a touch-and-display panel with both display and touch sensing functions. According to the different structural designs of a touch panel (touch screen or touch sensitive layer), the touch panel can be generally divided into out-cell or in-cell/on-cell touch panel. The out-cell touch panel is a combination of independent touch panel and general display panel, while the in-cell/on-cell touch panel directly sets the touch panel inside or outside the substrate in the display panel. Compared with the out-cell touch panel, the in-cell/on-cell touch panel has thinner thickness and higher light transmittance.

The touch panel is used for touch sensing operation, that is, users can touch the panel with fingers or other objects to perform various functions. The touch sensing operation of the touch panel may be interfered by the display operation of the display panel. Therefore, how to reduce the interference caused by the display operation of the display panel when the touch panel performs the touch sensing operation has become the goal of the industry.

SUMMARY

According to an aspect of the present disclosure, there is provided a method for driving an OLED touch-and-display device, the OLED touch-and-display device including a display panel including a plurality of rows of pixels, a plurality of gate driving lines (GL), and a plurality of light-emission control lines (EM) in one-to-one correspondence, wherein the method comprises: dividing each display frame into at least one display period and at least one touch detection period which are alternated; during each display period, generating sequentially-shifted gate driving signals and sequentially-shifted light-emission control signals, and sequentially applying the sequentially-shifted gate driving signals to at least a part of gate driving lines and sequentially applying the sequentially-shifted light-emission control signals to light-emission control lines corresponding to the part of gate driving lines; during each touch detection period, only suspending generation of the sequentially-shifted gate driving signals without suspending generation of the sequentially-shifted light-emission control signals, until the touch detection period ends; adjusting average display luminance of the plurality of rows of pixels within a predetermined time period, so that a deviation among a plurality of average display luminance values of the plurality of rows of pixels is less than a predetermined threshold, and enabling a gate driving signal applied to a gate driving line corresponding to each row of pixels and a light-emission control signal applied to a light-emission control line corresponding to the row of pixels to satisfy a preset timing relationship, wherein an average display luminance value of each row of pixels is related to a total light-emission time length of the row of pixels within the predetermined time period.

In addition, there is provided another method for driving the OLED touch-and-display device, which comprises: dividing each display frame into at least one display period and at least one touch detection period which are alternated; during each display period, generating sequentially-shifted gate driving signals and sequentially-shifted light-emission control signals, and sequentially applying the sequentially-shifted gate driving signals to at least a part of gate driving lines of the plurality of gate driving lines and sequentially applying the sequentially-shifted light-emission control signals to light-emission control lines corresponding to the at least part of gate driving lines; during each touch detection period, suspending generation of the sequentially-shifted gate driving signals and simultaneously suspending generation of the sequentially-shifted light-emission control signals, until the touch detection period ends; adjusting average display luminance of the plurality of rows of pixels within a predetermined time period, so that a deviation among a plurality of the average display luminance of the plurality of rows of pixels is less than a predetermined threshold, wherein an average display luminance value of each row of pixels is related to a total light-emission time length of the row of pixels within the predetermined time period.

According to another aspect of the present disclosure, there is also provided a driving circuit for a display panel in an OLED touch-and-display device, the display panel including a plurality of rows of pixels, a plurality of gate driving lines (GL), and a plurality of light-emission control lines (EM) in one-to-one correspondence, and the driving circuit is designed to execute the method as described above.

According to another aspect of the present disclosure, there is also provided an OLED touch-and-display device, which includes a display panel including a plurality of rows of pixels, a plurality of gate driving lines (GL), and a plurality of light-emission control lines (EM) in one-to-one correspondence; a touch sensitive layer and a touch controller; and the driving circuit for driving the display panel.

According to the driving method, the touch detection operation and display operation can be driven in a time-division manner, so that noise interference from display driving operation does not exist during touch detection operation, the touch detection operation does not take a long time, and therefore power can be saved. In addition, in the case where touch detection operation and display operation are driven in a time-division manner, there is no need to consider the timing and frequency of various signals related to display driving operation when selecting the frequency of the driving signal for touch detection operation, so there can be more selectable frequencies to combat other noise sources. In addition, the average display luminance of respective rows of pixels can be approximately the same, thereby making the display luminance of the display panel uniform, so as to improve the display effect.

BRIEF DESCRIPTION OF THE DRAWINGS

The accompanying drawings are intended to provide a further understanding of the embodiments of the disclosure and constitute a part of the specification, and together with the embodiments of the disclosure, serve to explain the disclosure, and do not constitute a limitation on the disclosure. In the drawings, the same reference numerals generally represent the same/similar components or steps.

FIGS. 6A-6B show flowcharts of another method for driving the OLED touch-and-display device according to an embodiment of the present disclosure.

DETAILED DESCRIPTION

Figure 1:
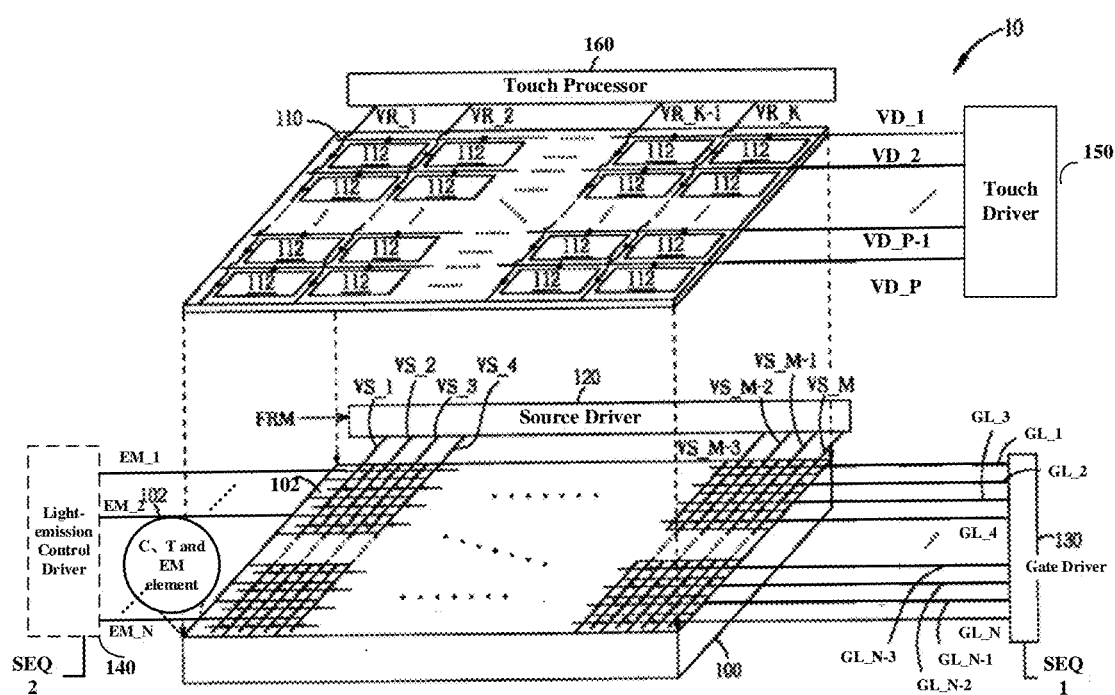
FIG. 1 is a schematic diagram of a touch-and-display device according to an embodiment of the present disclosure.

The word "coupled (or connected)" as used throughout this disclosure (including the claims) may refer to any direct or indirect connection means. For example, if it is described that the first device is coupled (or connected) to the second device, it should be interpreted that the first device can be directly connected to the second device, or the first device can be indirectly connected to the second device through other devices or some connection means. The terms "first" and "second" mentioned in the whole specification of this disclosure (including the claims) are used to name elements or distinguish different embodiments, but are not used to limit the upper limit or lower limit of the number of elements or the order of elements. In addition, wherever possible, elements/components/steps using the same reference numerals in the drawings and embodiments represent the same or similar parts. Elements/components/steps using the same reference numerals or using the same terms in different embodiments can refer to the relevant descriptions. An expression used in the singular may encompass the expression of the plural, and an expression used in the plural may also encompass the expression of the singular, unless it has been clearly defined in the context.

FIG. 1 is a schematic diagram of a touch-and-display device 10 according to an embodiment of the present disclosure.

Referring to FIG. 1, the touch-and-display device 10 includes a display panel 100, a touch sensitive layer 110, a source driver 120, a gate driver 130, a light-emission control driver 140 (which may not be provided depending on the circuit structure of the pixel unit), a touch driver 150, and a touch processor 160 (the touch driver 150 and the touch processor 160 may be collectively referred to as a touch controller). Although each driver for the display panel is shown separately in FIG. 1, as an example, respective drivers can be integrated in one circuit as a driving circuit (e.g., a driving IC), and the driving circuit can also include various computing processing functions, and each module for the touch sensitive layer (e.g., a touch driver and a touch processor) can also be integrated in one module.

The display panel 100 includes pixel units 102 arranged in a two-dimensional matrix (which may be used interchangeably with "pixel"; hereinafter), and therefore includes a plurality of gate driving lines, a plurality of data lines (source lines) arranged perpendicularly to the gate lines, and optionally a plurality of light-emission control lines (for example, in the case of adopting the circuit structure shown in FIG. 2A for the pixel unit). The pixel unit 102 includes a circuit composed of one or more capacitor, a switching element (for example, TFT), and a light emitting element (for example, an Organic Light Emitting Diode (OLED)). Similarly, the touch sensitive layer 110 also includes touch sensitive cells 112 arranged in a two-dimensional matrix, thus including a plurality of touch driving lines and a plurality of touch sensing lines.

The source driver 120 generates source driving signals VS_1 to VS_M according to an image signal FRM to be displayed, so as to indicate the color intensity of pixel units 102 through data lines. The gate driver 130 sequentially generates gate driving signals GL_1-GL_N according to a timing signal SEQ1 to indicate the update timing of the pixel units 102, that is, for each row of pixels connected by each gate driving line, switching elements which are in the row of pixels and which are corresponding to the writing of data are turned on according to a gate driving signal applied to the gate driving line, so that data can be written into the row of pixels through the data lines. M and N are both integers greater than or equal to 1.

Figure 2A:
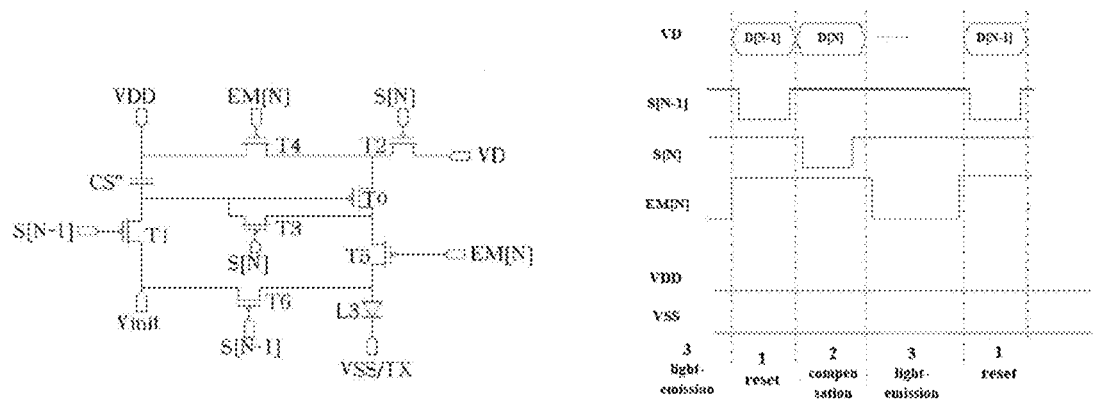
FIG. 2A shows a circuit structure diagram of a pixel unit.

Meanwhile, when the pixel unit is, for example, a pixel unit as shown in FIG. 2A, the touch-and-display device 10 should further include a light-emission control driver 140, which sequentially generates light-emission control signals EM_1 to EM_N according to a timing signal SEQ2 to indicate the light-emission timing of the pixel units 102. For each row of pixels, the gate driving signal and the light-emission control signal are in one-to-one correspondence. For each row of pixels connected to each light-emission control line, light-emission elements in the row of pixels emit light according to a light-emission control signal applied to the light-emission control line.

Meanwhile, the touch driver 150 generates a plurality of driving signals VD_1-VD_P to be applied to the touch driving lines for triggering the touch sensitive cells 112. The triggered touch sensitive cells 112 generates sensing signals (touch detection signals) VR_1 to VR_K. Since touching each touch sensitive cell 112 will change the capacitance or resistance value of the touch sensitive cell 112 (depending on whether the touch sensitive cell 112 is a capacitive or resistive sensitive cell), touch detection signals generated by the touched touch sensitive cells 112 are different from touch detection signals generated by the untouched touch sensitive cells 112. In this way, the touch processor 160 can determine the position of the touched touch sensitive cells 112 according to the change of the touch detection signals VR_1 to VR_K, where K and P are both integers greater than or equal to 1.

It should be noted that the touch-and-display device 10 can be an out-cell touch-and-display device or an in-cell/on-cell touch-and-display device, which is not limited by this disclosure. In addition, because the resolution requirement of the touch sensitive layer 110 is lower than that of the display panel 100, in order to save costs, the laying density of the touch sensitive cells 112 is lower than that of the pixel units 102.

Figure 2B:
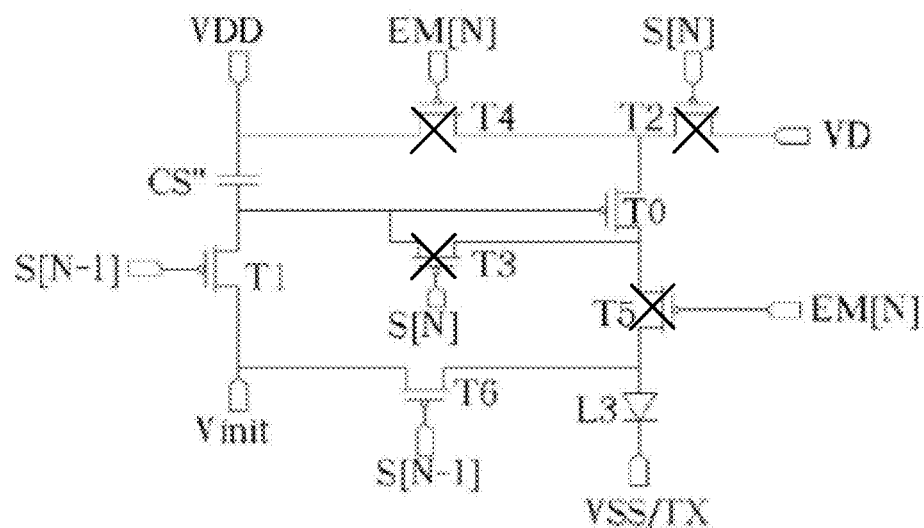
FIGS. 2B-2D show schematic diagrams of working process of the pixel unit in FIG. 2A.
Figure 2C:
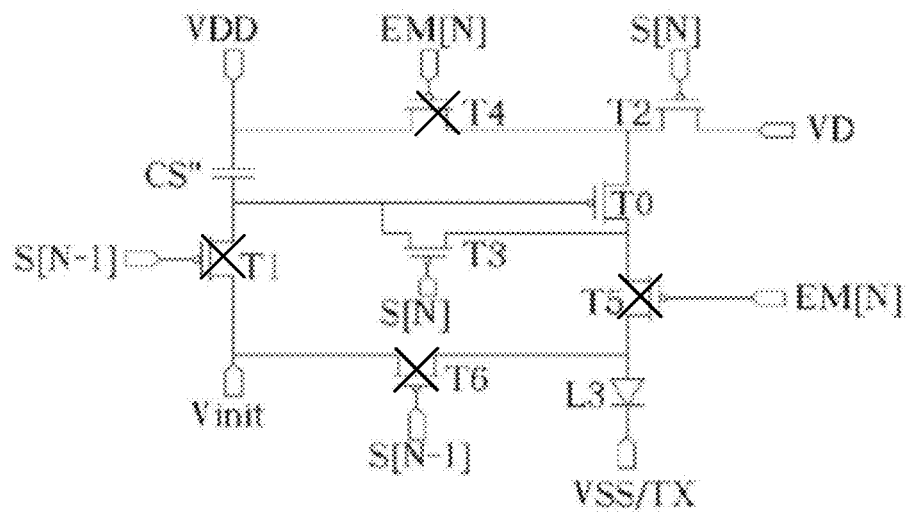
Figure 2D:
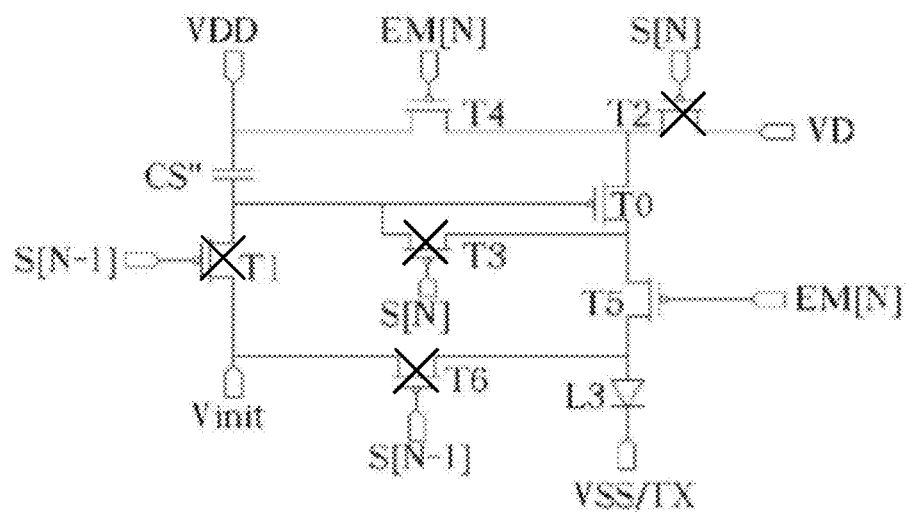

In a specific example, the circuit structure of the pixel unit 102 may be as shown in FIG. 2A, and the working process as shown in FIGS. 2B-D correspondingly.

FIG. 2A shows an exemplary circuit structure diagram of a pixel unit, and FIGS. 2B-D show schematic diagrams of the working process of the pixel unit. The pixel unit has a 7T1C structure with compensation function, which is composed of 7 TFT and 1 storage capacitor. However, it should be understood that pixel units of other structure with compensation function can also be used, for example, similar structures include 6T1C, 5T2C, etc. Alternatively, the pixel unit may also be a pixel unit having a structure without compensation function, such as 2T1C.

FIGS. 2B-D respectively show three stages of reset (1), compensation (2) and light-emission (3) of the working process of the pixel unit, in which the threshold voltage Vth of the switching element such as TFT is stored in the gate-source voltage Vgs first in the compensation stage, and the influence of Vth is counteracted by Vgs-Vth in the light-emission stage, thereby improving the current consistency in the circuit of the pixel unit.

In FIGS. 2A-D, EM[N] represents the light-emission control signal for current row of pixels (i.e., one of the signals EM_1-EM_N from the light-emission control lines in FIG. 1), and S [N] and S [N−1] respectively represent the gate driving signals for current row of pixels and previous row of pixels (i.e., two adjacent signals GL_1-GL_N from the gate driving lines in FIG. 1). In FIGS. 2A-D, low level of EM[N] and S[N] is regarded as active level, but the present disclosure is not limited to this, and active level of EM[N] and S [N] can be changed according to different specific circuits.

In the reset stage (1), as shown in FIG. 2B, the scan signal (gate driving signal) S[N] turns on the transistor T1 to pull the gate voltage of the driving transistor T0 to a lower level Vinit, so that the gate voltage can be compensated in the subsequent stage. It should be noted that the reset stage can be regarded as the end of the previous scanning cycle, and the display data VD outputs the previous piece of data D[N−1] at this time.

In the compensation stage (2), as shown in FIG. 2C, the display data VD is changed to current piece of data D[N], and the scan signal S[N] turns on the transistor T2 to write the data D[N] into the source voltage of the driving transistor T0. At this time, the transistor T3 is turned on, and the driving transistor T0 is connected in a diode-connected manner, so as to find out the threshold voltage Vth of the driving transistor T0 and eliminate the influence of the threshold voltage Vth on the luminance of the organic light-emission diode (OLED) L3, that is, compensate the luminance of the organic light emitting diode (OLED) L3.

Next, in the light-emission stage (3), as shown in FIG. 2D, the light-emission control signal EM[N] turns on the transistors T4 and T5, so that the drain current of the driving transistor T0 passes through the organic light-emission diode (OLED) L3, thereby controlling the organic light-emission diode (OLED) L3 to emit light.

In many OLED touch-and-display devices, display and touch detection are driven simultaneously. During display driving, the touch driver continuously outputs touch driving signals to a plurality of touch sensitive cells on the touch sensitive layer, and the touch processor acquires touch detection signals from the touch sensitive cells for touch detection. The touch driver and the touch processor can also be integrated into one circuit or be the same circuit. The touch sensitive cells on the touch sensitive layer can be formed based on self-capacitance and mutual-capacitance technology, and accordingly appropriate driving and sensing manners can be set, which are well known in the art, so the specific working process of touch detection will not be described here.

When display and touch detection are driven simultaneously, display and touch detection can be driven synchronously or asynchronously. For example, display and touch detection can be driven completely independently, and there is no correlation between their timings, which corresponds to the case of asynchronous driving. As another example, various timing signals for the display panel (such as VSYNC, HSYNC, GSTV, EMSTV, EMCK, etc.) can be used to generate the touch driving signals, which corresponds to the case of synchronous driving.

In addition, in the touch detection operation, a plurality of touch detection operations may be performed in each display frame, and each touch detection operation may be to perform touch detection on a part of the touch sensitive cells. For example, a plurality of touch sensitive cells on a touch sensitive layer can be divided into 20 groups, and touch detection is performed on the touch sensitive cells of each group in each touch detection operation.

Figure 3:
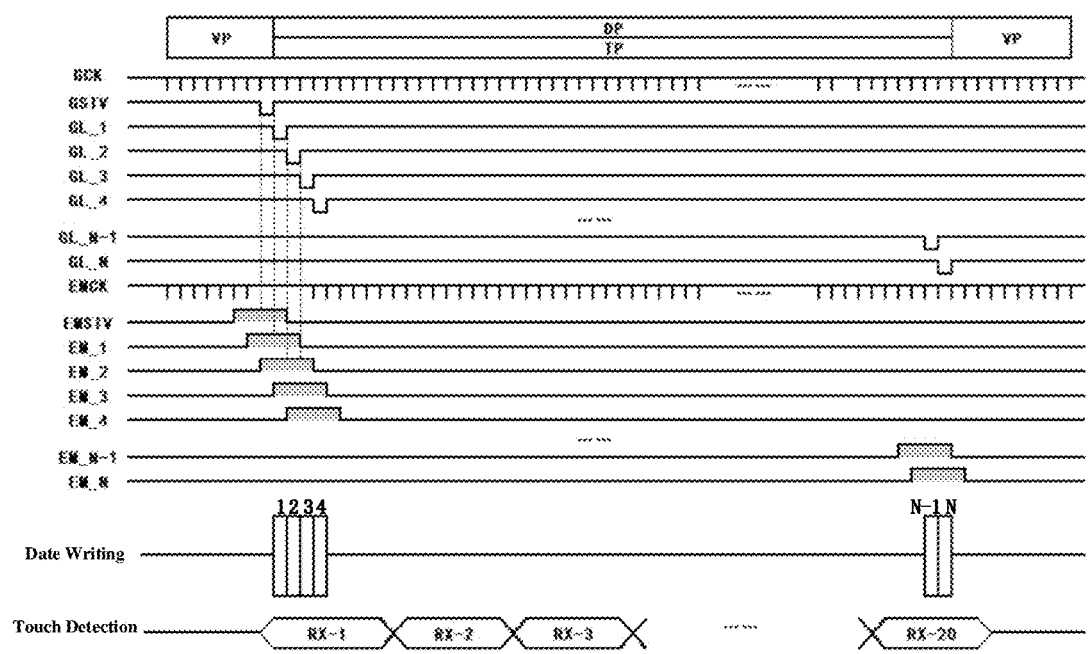
FIG. 3 shows a timing diagram related to signals generated by various drivers in the touch-and-display device.

FIG. 3 shows a timing chart related to various signals generated by each driver in the OLED touch-and-display device (taking the structure of the pixel unit shown in FIG. 2A as an example, it is also applicable to pixel units based on other structures). In FIG. 3, display and touch detection are driven simultaneously, and DP is used to represent display period, TP is used to represent touch detection period, and VP is used to represent invalid periods of each display frame.

As shown in FIG. 3, the gate driver can sequentially generate gate driving signals GL_1-GL_N according to a timing signal SEQ1 (including a first clock signal (GCK) and a first start signal (GSTV)), so as to transmit these signals to each row of pixels on the display panel (actually switching elements in pixel units). Similarly, the light-emission control driver can sequentially generate light-emission control signals EM_1 to EM_n according to another timing signal SEQ2 (including a second clock signal (EMCK) and a second start signal (EMSTV)), so as to transmit these signals to each row of pixels on the display panel respectively. In this example, active level pulse width of GSTV is equal to one clock cycle of the first clock signal (GCK), so each gate driving signal GL_1~GL_N is a pulse signal generated by shifting GSTV, and its active level pulse width is also equal to one clock cycle of the first clock signal (GCK), while inactive level pulse width of EMSTV is approximately equal to four clock cycles of the second clock signal (EMCK), therefore, each light-emission control signal EM_1~EM_N output to the light-emission control lines is a pulse signal generated by shifting EMSTV, and its inactive level pulse width is also approximately equal to four clock cycles, and the clock cycle of the first clock signal and the clock cycle of the second clock signal are equal. For each row of pixels, the gate driving signal and light-emission control signal applied to the gate driving line and light-emission control line corresponding to the row of pixels need to satisfy a specific preset timing relationship. For example, during the period when the gate driving signal is of active level, the light-emission control signal needs to maintain at inactive level, and optionally the light-emission control signal changes to active level only after a period of time after the gate driving signal changes to inactive level, as shown in FIGS. 2A and 3. In the embodiment of the present disclosure, among all the switching elements in each pixel unit included in the display panel, the low level serves as active level and the high level serves as inactive level of the switching elements, that is, the low level can turn on the switching elements in the pixel unit, while the high level can turn off the switching elements in the pixel unit. Of course, depending on the type of switching elements, the low level can be regarded as inactive level of the switching elements, and the high level can be regarded as active level of the switching elements.

Generally speaking, the driving IC (including various drivers for the display panel) can transmit the display data to the pixels on the display panel through thousands of data lines, and the gate driving signals and the light-emission control signals can be applied to each row of pixels on the display panel sequentially, the number of which depends on the resolution of the display panel. For example, the display panel can be a 2k×2k panel, which includes 2160 rows and 2160 columns of pixels, thus having 2160 data lines, 2160 gate driving signals G_1-G_2160 and 2160 light-emission control signals EM_1-EM_2160.

In the display period, for each row of pixels, under the control of active level pulse of the gate driving signal, the switching elements controlling the writing of data into the row of pixels are turned on, so that the display data can be written into the row of pixel units through the data lines. GL_1~GL_N are sequentially applied to pixel units on each gate driving line of the display panel, corresponding EM_1~EM_N are sequentially applied to pixel units on each light-emission control line of the display panel, to prohibit light-emission elements (e.g., OLED) in these pixel units from emitting light (the gates of switching elements for controlling light-emission elements to emit light in pixel units are at inactive level) when the corresponding gate driving signal is of active level. After display data is written into these pixel units by data lines, the light-emission elements in these pixel units emit light (the gates of switching elements for controlling the light-emission elements to emit light in pixel units are at active level, which will be simply described as "making the pixel emit light" for convenience of description). It should be noted that the period of writing data into a row of pixel units through data lines should correspond to the period when the gate driving signal corresponding to the row of pixel units is of active level, and the light-emission control signal corresponding to the row of pixel units should be at inactive level to cut off the conduction path of the OLED, so as to avoid the influence of the writing of data on the display of the display panel. As shown in FIG. 3, taking the first row of pixels as an example, before GL_1 becomes active level, EM_1 has become inactive level (for example, the starting point of inactive level of EM_1 is ahead of the starting point of active level of GL_1 for a preset period of time, which is shown as two clock cycles, but it can also be other clock cycles), and during the period when GL_1 is active level, EM_—1 maintains at inactive level and the data is written into the first row of pixels, and EM_1 maintains at inactive level until a period of time after the GL_1 becomes inactive level again ends (the period of time is illustrated as one clock cycle, but it can be other number of clock cycles).

As mentioned earlier, in OLED touch-and-display devices, display and touch detection are mostly driven simultaneously, in this case, there are the following defects.

(1) With regard to power consumption: in the case of simultaneous driving, display driving related noises can be detected during touch detection, and in order to suppress these noises, it is necessary to increase the time of touch detection, so as to suppress noises by receiving data acquired for a longer time, however, this method requires a longer detection time, and therefore consumes more power.

(2) With regard to touch detection frequency (i.e., the frequency of touch driving signals): in the case of simultaneous driving, the touch detection frequency will involve the frequency of display driving related signals, that is, the frequency of touch driving signals needs to be selected to avoid the frequency that may seriously interfere with the display driving. Generally speaking, besides the frequency of display driving, various unavoidable external noises (such as power noise, etc.) need to be considered in the selection of the frequency of touch driving signals, therefore, the problem of interference to the frequency of display driving leads to more limited selection of the frequency of touch driving signals.

In addition, no matter whether synchronous or asynchronous driving methods are adopted, gate driving is also performed on the display panel to scan each row of pixels during the touch detection operation, and different data voltages (voltages associated with display data) are also transmitted on the data lines according to different display screen contents, and these display screen contents are usually unpredictable by the touch processor, and due to factors such as parasitic capacitance between the data lines and the touch sensitive cells, changes of these data voltages may cause unexpected interference, i.e., noise, during the touch detection operation. In this way, the touch processor can only use longer time for touch detection, so as to obtain more real touch sensing signals through longer time detection, so as to improve the signal-to-noise ratio (SNR) and avoid false touch detection results due to poor SNR.

Therefore, in the embodiment of this disclosure, it is proposed to adopt time-division manner for driving touch detection and display in OLED touch-and-display devices. In this way, there is no noise interference from the display driving operation when the touch detection operation is performed, so that the touch detection does not take a longer time, and therefore power can be saved. In addition, under the condition that touch detection and display are driven in a time-division manner, there is no need to consider the timing and frequency of various signals related to display driving operation when selecting the frequency of the driving signal for touch detection operation, so there can be more selectable frequencies to combat other noise sources.

The time-division driving of touch detection and display can be realized through the control of a first clock signal (GCK) and a second clock signal (EMCK) with equal clock cycles. As described above, the gate driving signals and the light-emission control signals are generated based on the first clock signal and the second clock signal and output to the display panel by the gate driver and the light-emission control driver (which can be integrated into the driving IC). Therefore, the time period of display driving operation and touch detection operation can be arbitrarily configured, and the output of at least one of the first clock signal and the second clock signal is correspondingly interrupted to realize time-division control.

In the design process, it is necessary to make the average display luminance of the display panel of the touch-and-display device uniform. Because the average display luminance of each row of pixels is related to their light-emission time length, when it is refined to each row of pixels, it is expected that the light-emission time lengths of all rows of pixels are equal so that the average display luminance of all row of pixels is basically equal.

Therefore, an embodiment of the present disclosure proposes a method for driving an OLED touch-and-display device, which is used to ensure that the display luminance of the display panel of the OLED touch-and-display device uniform in the case of time-division driving of touch detection and display. The OLED touch-and-display device includes a display panel including a plurality of rows of pixels, a plurality of gate driving lines (GL), and a plurality of light-emission control lines (EM) in one-to-one correspondence.

Figure 4A:
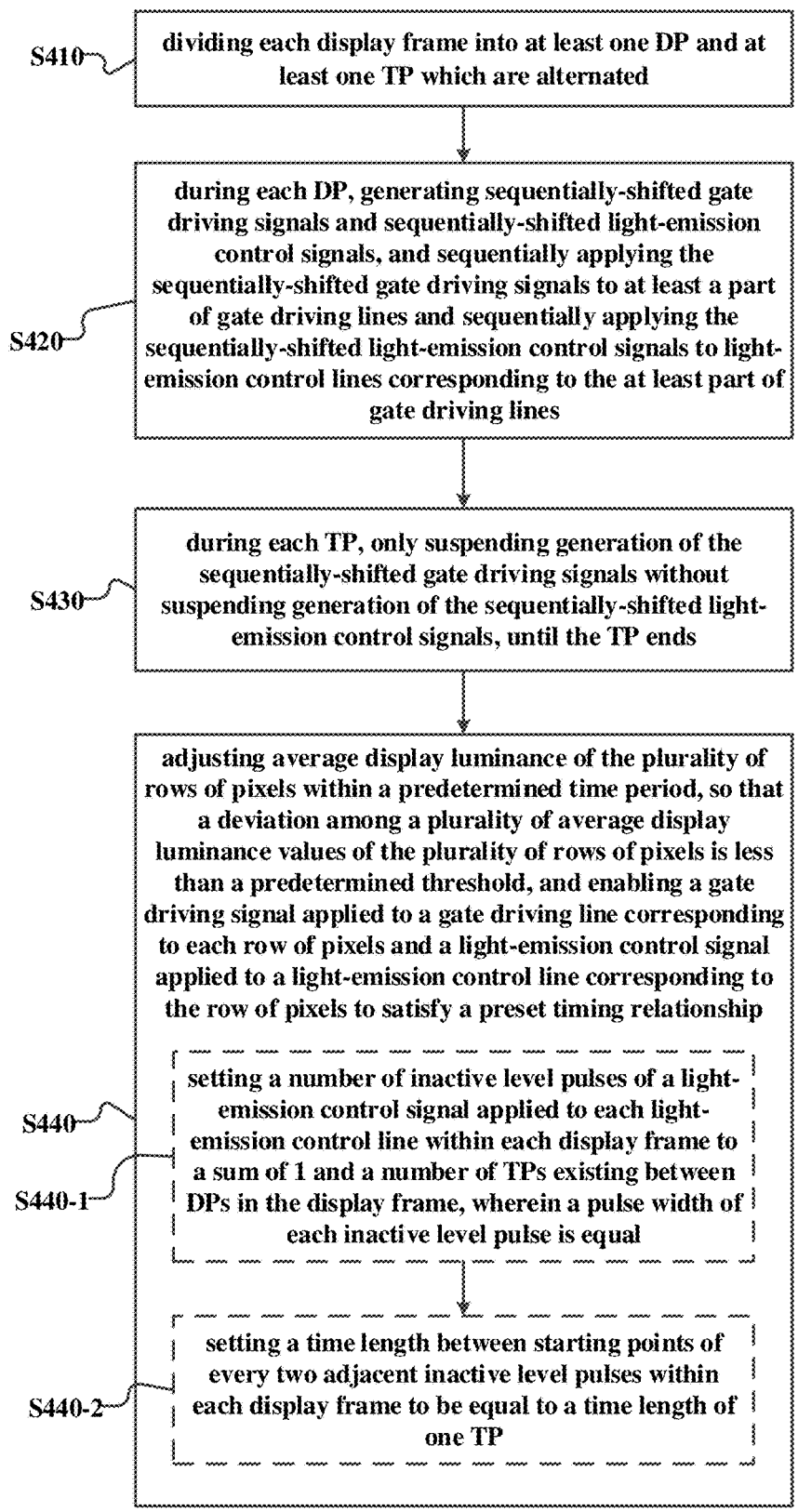
FIG. 4A shows a flowchart of a method for driving the OLED touch-and-display device according to an embodiment of the present disclosure.
Figure 4B:
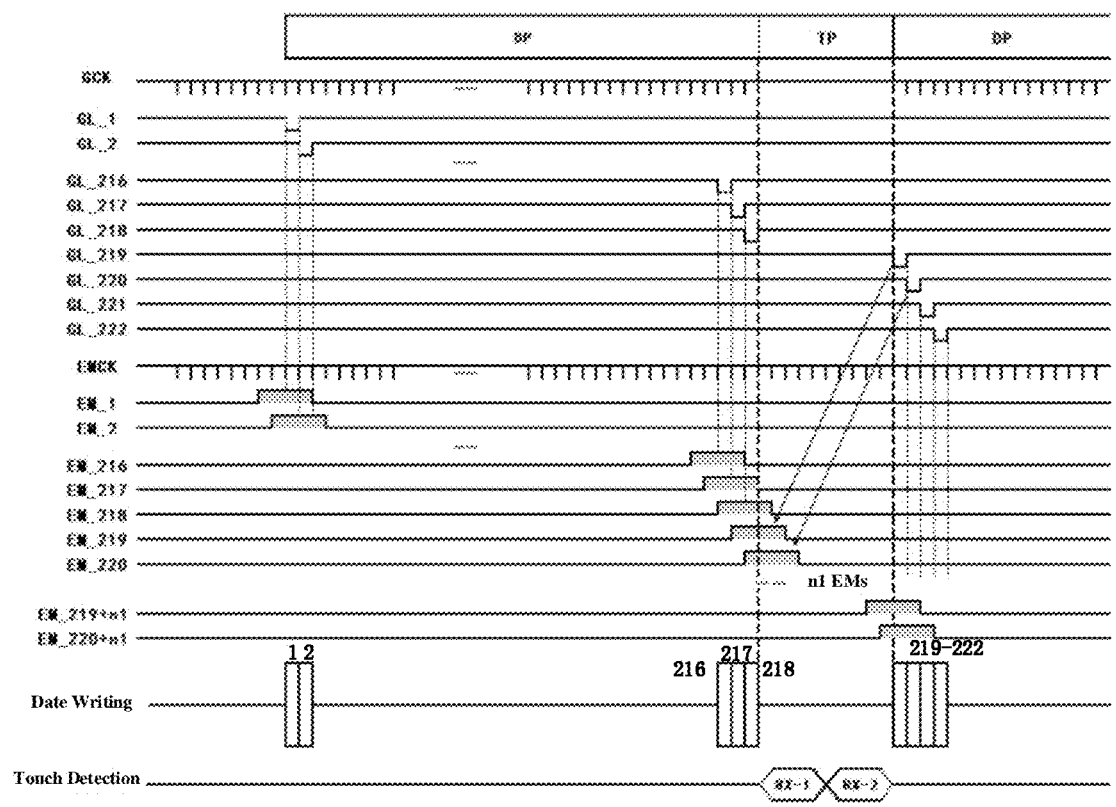
FIG. 4B shows a timing diagram of various signals when only generation of the sequentially-shifted gate driving signals is suspended, but generation of the sequentially-shifted light-emission control signals is not suspended, in a case where the touch detection and display are driven in a time-division manner.
Figure 4C:
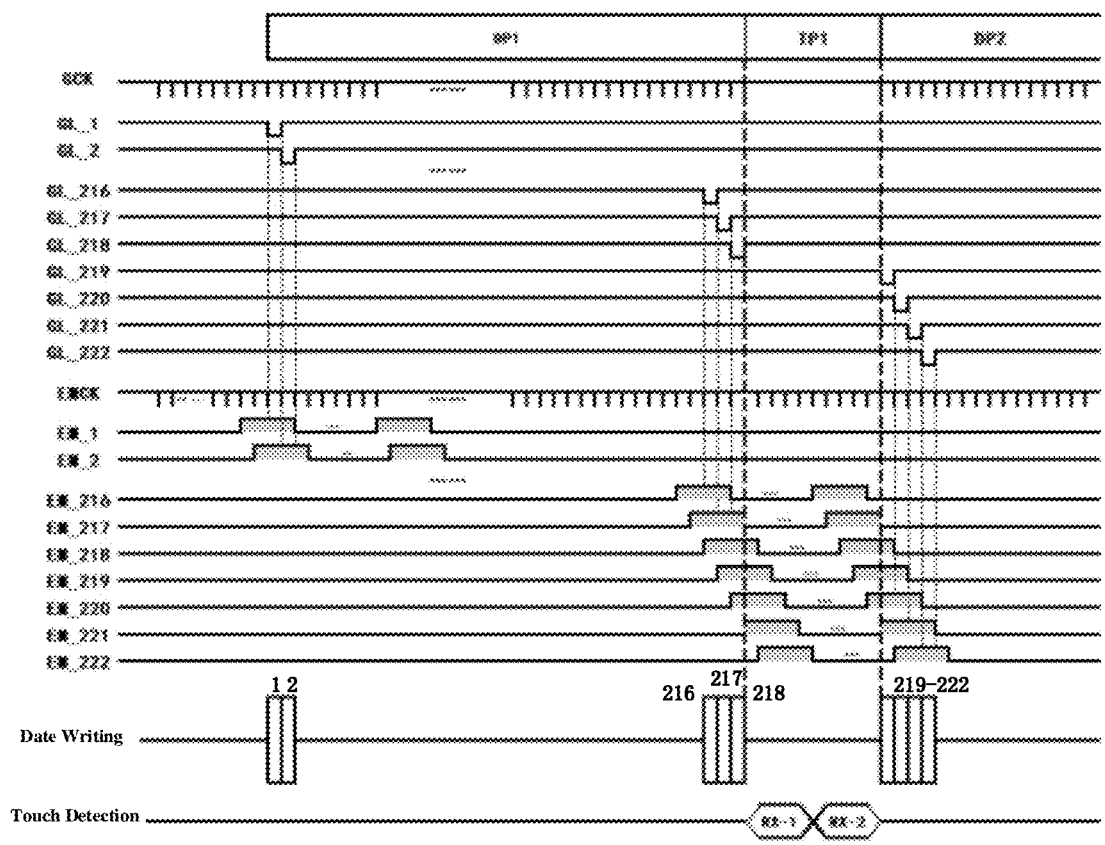
FIGS. 4C-4D shows timing diagrams of various signals when only generation of the sequentially-shifted gate driving signals is suspended, but generation of the sequentially-shifted light-emission control signals is not suspended, in a case where the touch detection and display are driven in a time-division manner, after adopting the method described with reference to FIG. 4A.
Figure 4D:
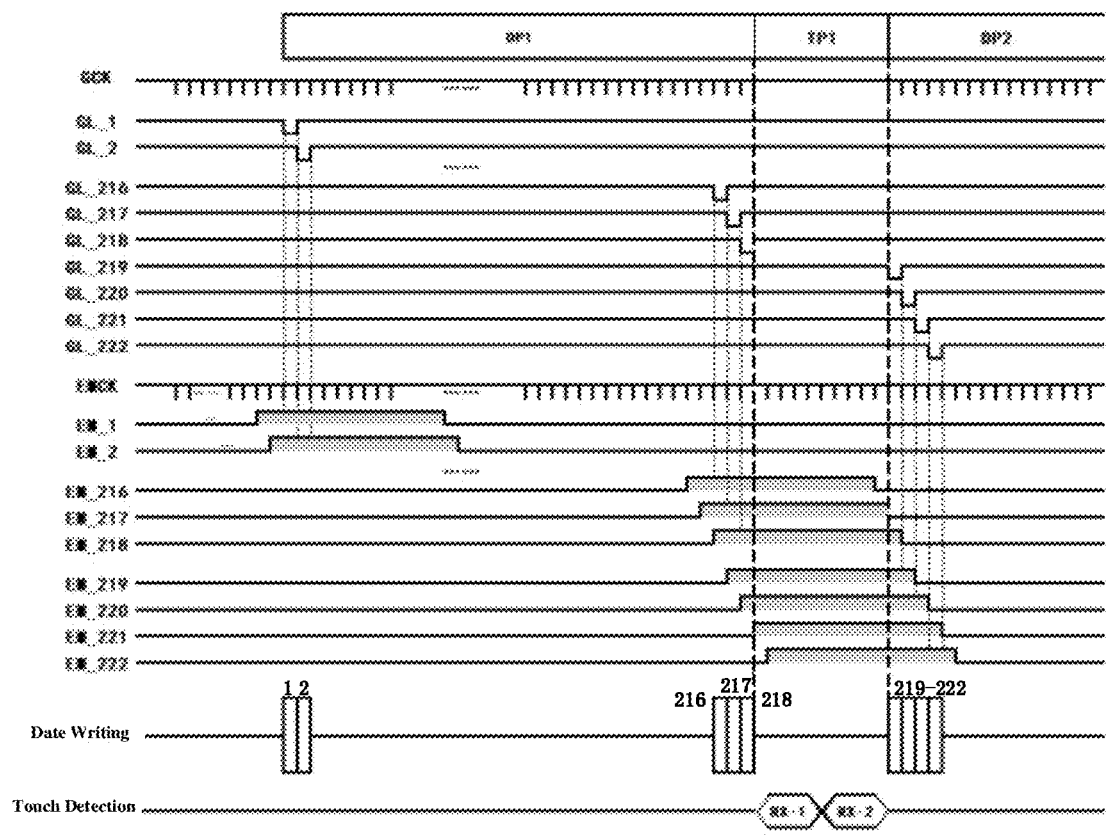

FIG. 4A shows a flow chart of the method for driving the OLED touch-and-display device. FIG. 4B shows a timing diagram of various signals when only generation of the sequentially-shifted gate driving signals (also referred to as shift of a gate driving signal) is suspended, but generation of the sequentially-shifted light-emission control signals (also referred to as shift of a light-emission control signal) is not suspended, in a case where the touch detection and display are driven in a time-division manner. FIGS. 4C-4D shows timing diagrams of various signals when only generation of the sequentially-shifted gate driving signals is suspended, but generation of the sequentially-shifted light-emission control signals is not suspended, in a case where the touch detection and display are driven in a time-division manner, after adopting the specific method described with reference to FIG. 4A.

As shown in FIG. 4A, in step S410, each display frame is divided into at least one display period and at least one touch detection period which are alternated.

For example, each display frame is sequentially divided into a first display period, a first touch detection period, a second display period, a second touch detection period. The X-th display period and the X-th touch detection period, wherein X is an integer greater than or equal to 2. The first display period of each display frame may start after the invalid period in the head part of the display frame, and the X-th touch detection period may end before the invalid period in the tail part of the display frame.

In each touch detection period, touch detection of at least a part of the touch sensitive cells may be performed. For example, a plurality of touch sensitive cells on the touch sensitive layer 110 shown in FIG. 1 can be divided into a plurality of groups (e.g., 20 groups), which respectively correspond to a plurality of touch detection operations (e.g., RX-1, RX-2, . . . , RX-20), and in each touch detection period, touch detection can be performed on a plurality of touch sensitive cells included in one or more groups. As shown in FIG. 4A, touch detection can be performed on touch sensitive cells included in the first two groups during one touch detection period shown.

At step S420, during each display period, sequentially-shifted gate driving signals and sequentially-shifted light-emission control signals are generated, the sequentially-shifted gate driving signals are sequentially applied to at least a part of gate driving lines, and the sequentially-shifted light-emission control signals are sequentially applied to light-emission control lines corresponding to the at least part of gate driving lines.

For example, each display frame is divided into a plurality of alternating display periods and touch detection periods, wherein the display frame sequentially comprises a first display period, a first touch detection period, a second display period and a second touch detection period, and the sequentially-shifted gate driving signals are generated for a first number of rows of pixels in the first display period; and the sequentially-shifted gate driving signals are generated for a second number of rows of pixels in the second display period, where the second number of rows of pixels are immediately after the first number of rows of pixels.

Optionally, the sequentially-shifted gate driving signals and the sequentially-shifted light-emission control signals are generated by: generating sequentially-shifted gate driving signals based on a first clock signal (GCK) with a shift time length (step) equal to the clock cycle of the first clock signal, and generating sequentially-shifted light-emission control signals based on a second clock signal (EMCK) with a shift time length (step) equal to the clock cycle of the second clock signal, where the first clock signal and the second clock signal have the same clock cycle. It should be understood that although the first clock signal (GCK) and the second clock signal (EMCK) are respectively described in this disclosure, only one clock signal may be used as the first clock signal (GCK) and the second clock signal (EMCK) in the case where the first clock signal and the second clock signal have the same clock cycle. The gate driving signals and the light-emission control signals are pulse signals, and for each gate driving signal, during the period when the gate driving signal is of active level, the light-emission control signal applied to the light-emission control line corresponding to the gate driving line to which the gate driving signal is applied is of inactive level. Herein, for the convenience of description, the gate driving signal and the light emission control signal applied to the gate driving line and the light emission control line corresponding to each row of pixels can also be regarded as being corresponding. For example, in FIG. 3, EM_1 is of inactive level (high level) during the period when GL_1 is of active level. After EM_1 becomes active level, the first row of pixels can emit light.

In addition, for each row of pixels, the gate driving signal and the light-emission control signal for the row of pixels should satisfy the preset timing relationship that the light-emission control signal applied to the light-emission control line corresponding to the row of pixels is of inactive level during the period when the gate driving signal applied to the gate driving line corresponding to the row of pixels is of active level. That is to say, during each display period, a part of the gate driving lines and a part of light-emission control lines corresponding to a part of rows of pixels are sequentially applied with gate driving signals and light-emission control signals, respectively, so that these pixels can normally perform the writing of data (for example, when the gate driving signals are at active level) and emit light under the control of their respective gate driving signals and light-emission control signals.

In addition, in the touch detection period, because the gate driving signal stops shifting, it is not necessary to write the display data from the data lines. In this case, the data lines can maintain at a voltage associated with previous display data or be set to a preset voltage (a voltage associated with preset display data), so that the touch detection operation will not receive the noise from the display panel. At this time, because the gate driving signal applied to any gate driving line on the display panel is inactive, the writing of data will not be performed, so the voltage on the data lines can maintain at any voltage without affecting the display operation.

At step S430, during each touch detection period, only generation of the sequentially-shifted gate driving signals is suspended, but generation of the sequentially-shifted light-emission control signals is not suspended, until the touch detection period ends.

Specifically, because the display operation and the touch detection operation are to be driven in a time-division manner, it is necessary to suspend the display driving operation during each touch detection period, and thus the writing of data into pixels can be suspended. Furthermore, because the average display luminance of pixels is controlled by active level time length of corresponding light-emission control signal, the average display luminance of the touch-and-display device can be ensured to be basically uniform by making active level time length of the light-emission control signal applied to the light-emission control line corresponding to each row of pixels basically equal in the case of time-division driving of display and touch detection. Therefore, the generation of the sequentially-shifted light-emission control signals is not suspended. The generation of the sequentially-shifted light-emission control signals is not suspended during the touch detection period, that is, the light-emission control signals are normally shifted, so as to avoid the following situation: under the condition of suspending the shifting of the light-emission control signals, the light-emission control signals which are at inactive level when the touch detection period starts will continue to maintain inactive level during the touch detection period, so that active level time lengths of the light-emission control signals of some rows of pixels are different from those of light-emission control signals of other rows of pixels, resulting in un-uniform average display luminance between rows of pixels. This un-uniform average display luminance is caused by the fact that total light-emission time lengths of all rows of pixels in a predetermined time period (for example, one display frame) are not equal.

In addition, in the design of some touch-and-display devices, in order to simplify the design, the gate driver can apply touch driving signals to the touch sensitive cells on the touch sensitive layer through the gate driving lines during the touch detection period (only the amplitude of the touch driving signal is not enough to turn on the switching elements in the pixel units, so the display operation of the display panel will not be affected). Therefore, in the touch detection period, the gate driver does not generate sequentially-shifted gate driving signals, but needs to be multiplexed as a touch driver to generate the touch driving signals.

In step S440, average display luminance of the plurality of rows of pixels is adjusted within a predetermined time period, so that a deviation among a plurality of the average display luminance values of the plurality of rows of pixels is less than a predetermined threshold, and a gate driving signal applied to a gate driving line corresponding to each row of pixels and a light-emission control signal applied to a light-emission control line corresponding to the row of pixels satisfy a preset timing relationship, wherein an average display luminance value of each row of pixels is related to a total light-emission time length of the row of pixels within the predetermined time period.

Optionally, the predetermined time period may be one display frame.

It should be noted that the sequentially-shifted light-emission control signals are still generated during the touch detection period, and the generation of the gate driving signals is suspended, so for some rows of pixels, the gate driving signals and corresponding light-emission control signals may no longer satisfy the timing relationship, thus causing driving abnormality, which will be explained in more detail with reference to FIG. 4B.

As shown in FIG. 4B, the Display Period (DP) (for display driving) and the touch detection period are time-divided, which is different from the simultaneous relationship of DP and TP shown in FIG. 3

In the touch detection period, the second clock signal (EMCK) is not suspended, but the first clock signal (GCK) is suspended. At this time, the generation of the sequentially-shifted gate driving signal is suspended, while the generation of the sequentially-shifted light-emission control signal continues according to the clock cycle of the second clock signal (EMCK), where the clock cycles of the first clock signal and the second clock signal are the same. As shown in FIG. 4B, after the stage of the writing of data in the 218th row of pixels is completed (the gate driving signal lasts for one GCK cycle), the touch detection period starts, and after the touch detection period ends, the gate driving signal for the 219th row of pixels changes to be at active level again, so as to perform the writing of data of the row of pixels. At the same time, in the touch detection period, the generation of the sequentially-shifted light-emission control signal is still performed downward from the 218th row of the pixels.

When a touch detection period starting after the writing of data into a certain specific row of pixels ends, another display period starts, and the gate driving signal for the one row of pixels after the specific row of pixels is generated. In the display period, for each row of pixels after the specific row of pixels, the gate driving signal and the light-emission control signal for the row of pixels also need to satisfy the preset timing relationship, to realize normal display. However, because the generation of the sequentially-shifted light-emission control signals is not suspended during the touch detection period, the timing of the gate driving signal and the light-emission control signal for each row of pixels after the specific row of pixels may be wrong, resulting in driving abnormality. As shown in FIG. 4B, after the gate driving signal for the 218th row of pixels becomes inactive level, the touch detection period starts, and the touch detection period (TP) lasts for n1 GCKs. Because in the touch detection period the light-emission control signal is shifted by n1 rows (1 GCK corresponds to the shift of one row) but the gate driving signal is not shifted, when the gate driving signal for the 219th row of pixels becomes active level and the writing of data into the 219th row of pixels is ready, the light-emission control signal generated at this time is already the light-emission control signal for the 219th+n1 row of pixels, so the timing of the gate driving signal and the light-emission control signal for the 219th row of pixels is wrong. On the other hand, as shown in FIG. 4B, when the gate driving signal for the 219th row of pixels becomes active level and the writing of data into the 219th row of pixels is ready, the light-emission control signal EM_219 has already become active level, so the 219th row of pixels will emit light during the writing of data, which is also not allowed.

Therefore, it is necessary to adjust the average display luminance of the plurality of rows of pixels, so that a plurality of average display luminance values of the plurality of rows of pixels are basically the same, within the predetermined time period; and to enable the gate driving signal applied to the gate driving line corresponding to each row of pixels and the light-emission control signal applied to the light-emission control line corresponding to the row of pixels to satisfy a preset timing relationship. For example, the preset timing relationship can be as follows: during the period when the gate driving signal applied to the gate driving line corresponding to each row of pixels is of active level, the light-emission control signal applied to the light-emission control line corresponding to the row of pixels is of inactive level. Of course, depending on the circuit structure of the pixel unit, the preset timing relationship can be defined differently, which will not be specifically limited therein.

According to a specific example, step S440 may include the following sub-steps.

At step S440-1, the number of inactive level pulses of a light-emission control signal applied to each light-emission control line within each display frame is set to the sum of the number of touch detection periods existing between display periods in the display frame and 1, wherein the pulse width of each inactive level pulse is equal.

For example, each display frame may be sequentially divided into a first display period, a first touch detection period, and a second display period, so that the number of touch detection periods existing between the display periods is one, and the number of inactive level pulses of each light-emission control signal may be set to two. For another example, each display frame may be sequentially divided into a first display period, a first touch detection period, a second display period, a second touch detection period, a third display period, and a third touch detection period, so that the number of touch detection periods existing between the display periods is two, and the number of inactive level pulses of each light-emission control signal may be set to three. That is, every time one touch detection period existing between display periods is added, the number of inactive level pulses of the light-emission control signal increases by one.

In each touch detection period, touch detection of at least a part of touch sensitive cells on the touch sensitive layer is performed, as in FIG. 4C, a first touch detection operation RX-1 (for example, corresponding to the first group of touch sensitive cells) and a second touch detection operation RX-2 (for example, corresponding to the second group of touch sensitive cells) are performed.

At step S440-2, the time length between starting points of every two adjacent inactive level pulses within each display frame is set to be equal to the time length of one touch detection period.

In this way, each row of pixels can have the same light-emission time length, thus having the same average display luminance. In addition, this arrangement can also enable the gate driving signal and the light-emission control signal for each row of pixels to maintain a specific preset timing relationship to avoid driving abnormality. With reference to FIG. 4C, the principle that the gate driving signal and the light-emission control signal for each row of pixels can maintain the specific preset timing relationship based on the above steps will be explained in detail below.

As shown in FIG. 4C, each display frame may be sequentially divided into a first display period DP1, a first touch detection period TP1 and a second display period DP2, and there is only one touch detection period in the display frame, so the number of inactive level pulses of the light-emission control signal is set to two.

In a case where the generation of the sequentially-shifted gate driving signals is suspended but the generation of the sequentially-shifted light-emission control signals is not suspended during the first touch detection period TP1 after the first display period DP1 (after the gate driving of the 218th row of pixels is completed and the writing of data is already performed), when the second display period DP2 starts after the first touch detection period TP1 ends, the first gate driving signal (GL_219) and the corresponding light-emission control signal (EM_219) generated in the second display period can also satisfy the preset timing relationship. This is because before the touch detection period (TP1) starts, for each of the first to 218th rows of pixels, the inactive level pulse (the first one on the left in FIG. 4C) that lags behind in time of the light-emission control signal (EM_1~EM_218) and the gate driving signal (GL_1~GL_218) for the row of pixels satisfy the preset timing relationship, during the touch detection period, the light-emission control signals (EM_219 and subsequent light-emission control signals) continue to shift downward, while the gate driving signals (GL_219 and subsequent gate driving signals) suspend shifting, and when the touch detection period ends, inactive level pulse of each of the light-emission control signal EM_219 and subsequent light-emission control signals ahead in time (e.g., the first inactive level pulse on the right side of the light-emission control signal EM_219 shown in FIG. 4C) can also maintain at inactive level during the period when the corresponding gate driving signal (GL_219 and subsequent gate driving signals) is of active level, thus preventing the pixels from emitting light.

In view of the above situation of generating the light-emission control signal with two inactive level pulses, the light-emission control driver may output one inactive level pulse on the second start signal EMSTV first, and output another inactive level pulse after a predetermined interval, which is the time length of one touch detection period. Of course, according to system requirements, any number of inactive level pulses can be output at other predetermined intervals during each display frame. As described above, each light-emission control signal with any number of inactive level pulses may be sequentially applied to each light-emission control line according to the clock cycle of the second clock signal.

Accordingly, if there are more display periods and touch detection periods in one display frame, it is necessary to set more inactive level pulses for the light-emission control signal, and as described above, in order to maintain the preset timing relationship between the gate driving signal and light-emission control signal for each row of pixels, it is necessary to set the time length between the starting points of every two adjacent inactive level pulses to be equal to the time length of one touch detection period. Of course, it can also be considered that the time length between center points of every two adjacent inactive level pulses and the time length between end points of every two adjacent inactive level pulses are set equal to the time length of one touch detection period. In this way, since each light-emission control line is applied with a light-emission control signal with the same attribute, that is, light-emission control signals for all rows of pixels include inactive level pulses are of the same width and number, the light-emission time length of all rows of pixels is the same, so that average display luminance of all rows of pixels can be maintained to be uniform, and the light-emission control signal and the gate driving signal for each row of pixels can be ensured to satisfy the preset timing relationship, so that the driving can be normal.

Of course, in order to avoid reducing the light-emission time length of pixels due to the increase in the number of inactive level pulses of light-emission control signals, thus reducing the overall luminance of the display panel, the light-emission time length of pixels can be guaranteed by reducing the pulse width of inactive level pulses, that is, when the desired average display luminance of the display panel is determined, within each display frame, the pulse width of inactive level pulses of the light-emission control signal applied to each light-emission control line can be correlated with the number of inactive level pulses, where the larger the number of inactive level pulses, the smaller the pulse width of inactive level pulses. However, it should be understood that the pulse width of each inactive level pulse may be at least greater than 2 clock cycles, e.g., in the case that the working process of the circuit structure of the pixel unit include the reset stage, so as to avoid light-emission in the reset stage and compensation stage.

Further, the number and pulse width of inactive level pulses of the light-emission control signal can be used to adjust the overall luminance of the display panel. For example, if it is desired to reduce the overall luminance of the display panel, the following way can be used: increasing the pulse width of inactive level pulses of the lighting control signal and/or adding more inactive level pulses to reduce the light-emission time of pixels, and ensuring the preset timing relationship between the light-emission control signal and the gate driving signal for each row of pixels at the same time. For each row of pixels, only one of inactive level pulses of the light-emission control signal needs to be inactive during the period when the corresponding gate driving signal is active (during the writing of display data into the row of pixels).

The above approach of setting inactive level pulses of the light-emission control signal is only an example, and other approaches can be adopted by those skilled in the art. For example, when the number of touch detection periods is small, for each display frame, each light-emission control signal may still include only one inactive level pulse, the width of which may be, e.g., at least 2 clock cycles which is predetermined according to the circuit structure of the pixel unit plus the total time length of all touch detection periods in the display frame, and the end point of the active level pulse of the gate driving signal for the first row of pixels is at least the total time length of the touch detection period earlier than the end point of the inactive level pulse of the light emitting control signal for the first row of pixels. For example, as shown in FIG. 4D, only one touch detection period is set, and by extending the width of inactive level pulse from 4 clock cycles predetermined based on the circuit structure of the pixel unit by the time length of one touch detection period and by causing the end point of the active level pulse of the gate driving signal for the first row of pixels to be the sum of the time length of the touch detection period and one clock cycle ahead of the end point of the inactive level pulse of the light emitting control signal for the first row of pixels, it can be still allowed that the light-emission control signal for each row of pixels is of inactive level when the gate driving signal for the row of pixels is of active level. Therefore, the light-emission time length of each row of pixels is the same so that the average display luminance is basically the same, and the gate driving signal and the light-emission control signal for each row of pixels can also satisfy the preset timing relationship.

To sum up, based on the method described with reference to FIG. 4A, it is possible to make the light-emission time lengths of a plurality of rows of pixels of the display panel in the touch-and-display device basically the same within a predetermined time period (for example, within a display frame), so that the average display luminance is basically the same, and at the same time, the gate driving signal and the light-emission control signal for each row of pixels satisfy the preset timing relationship, so that the normal driving timing can be maintained.

It should be noted that although the steps described in FIG. 4A and the methods to be described later are shown in a sequential manner, it does not mean that they must be executed in the shown order, and they can be executed in any suitable other order, which is not limited by the present disclosure as long as the goal that the method aims to achieve can be achieved.

In the embodiments described above with reference to FIGS. 4A-4D, the touch detection operation and display operation are driven in a time-division manner, such that there is no noise interference from the display driving operation when the touch detection operation is performed, so that the touch detection does not take a long time, thus saving power. At the same time, in case of the time-division driving, there is no need to consider the timing and frequency of various signals related to display driving operation when selecting the frequency of the driving signal for touch detection operation, so there can be more selectable frequencies to combat other noise sources. In addition, during the touch detection period, only the generation of the sequentially-shifted gate driving signals is suspended without suspending the generation of the sequentially-shifted light-emission control signals, and the average display luminance of each row of pixels is adjusted, so that the average display luminance is uniform and the display effect can be improved, and the gate driving signals and light-emission control signals for each row of pixels are ensured to satisfy a preset timing relationship.

In other embodiments, it is also possible to suspend the generation of the sequentially-shifted gate driving signals and the generation of the sequentially-shifted light-emission control signals during the touch detection period, and adjust the average display luminance of each row of pixels to make the average display luminance uniform, so as to complete the time-division driving of touch detection and display.

Next, time-division driving of touch detection and display in the case where generation of sequentially-shifted gate driving signals and generation of sequentially-shifted light-emission control signals are suspended during the touch detection period will be described in detail with reference to FIGS. 5-9.

Figure 5:
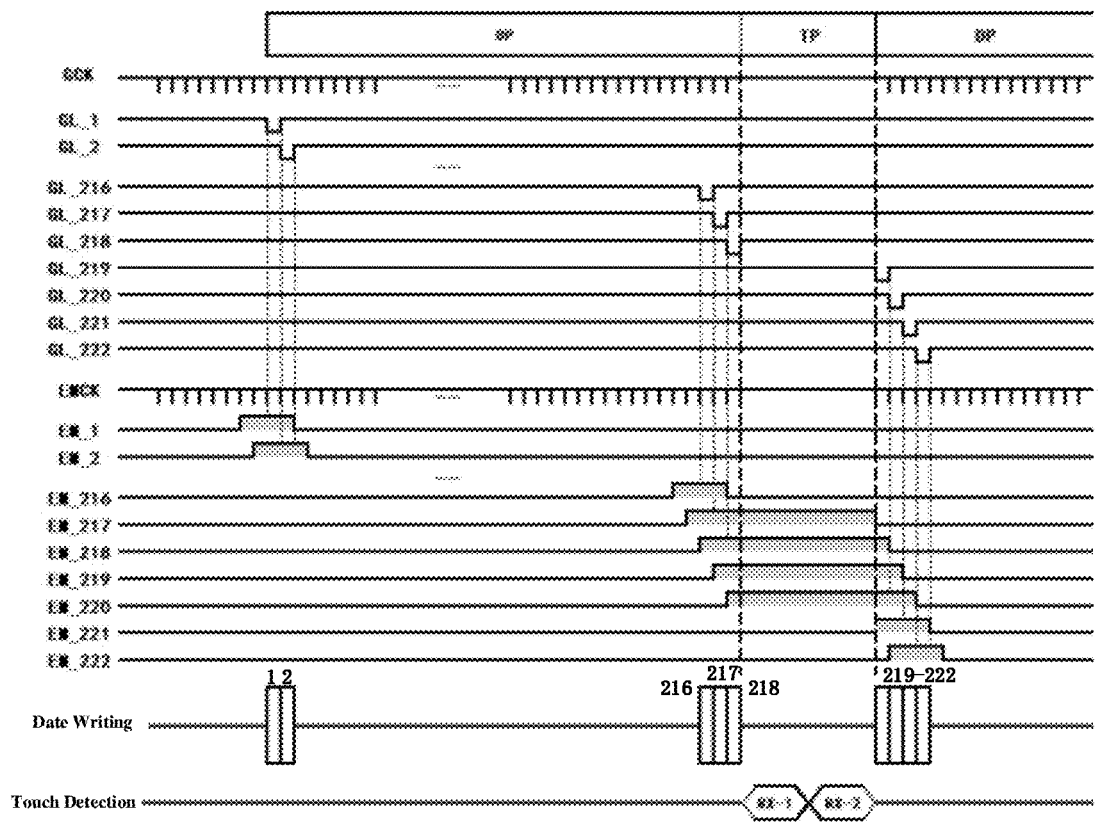
FIG. 5 shows a schematic timing diagram of various signals when generation of sequentially-shifted gate driving signals and generation of sequentially-shifted light-emission control signals are suspended during the touch detection period, in a case where the touch detection and display are driven in a time-division manner.

FIG. 5 shows a schematic timing diagram of various signals when generation of sequentially-shifted gate driving signals and generation of sequentially-shifted light-emission control signals are suspended during the touch detection period, in a case where the touch detection and display are driven in a time-division manner.

In detail, as shown in FIG. 5, during each display period, the sequentially-shifted gate driving signals are generated and the sequentially-shifted light-emission control signals are generated, and the sequentially-shifted gate driving signals and sequentially-shifted light-emission control signals are applied to at least a part of the plurality of gate driving lines and corresponding light-emission control lines, respectively.

Optionally, the sequentially-shifted gate driving signals are generated based on a first clock signal (GCK), the shift time length of which is equal to the clock cycle of the first clock signal, and the sequentially-shifted light-emission control signals are generated based on a second clock signal (EMCK), wherein the first clock signal and the second clock signal have the same clock cycle. The gate driving signals and the light-emission control signals are pulse signals, and for each gate driving signal, during the period when the gate driving signal is of active level, the light-emission control signal corresponding to the gate driving signal is applied should be at inactive level. For example, in FIG. 5, EM_1 is of inactive level (high level) during the period when GL_1 is of active level. After EM_1 becomes active level, the first row of pixels can emit light.

In order to drive the display operation and the touch detection operation in a time-division manner, it is necessary to suspend the display driving operation during the touch detection period. At this time, the generation of the sequentially-shifted gate driving signals and simultaneously the generation of the sequentially-shifted light-emission control signals may be suspended, until the touch detection period ends. In this way, during the touch detection period, both the gate driving signal and the light-emission control signal are suspended from shifting downward.

As shown in FIG. 5, when the touch detection period starts, that is, when the writing of data into the 218th row of pixels is finished, the gate driving signal and the light-emission control signal for the 218th row of pixels are suspended from shifting. The light-emission control signals (EM_217-EM_220) which are already at inactive level (high level in FIG. 5) will continue to maintain at inactive level, until the second clock signal (EMCK) is restored after the end of the touch detection period to control the shift again. When the second clock signal (EMCK) is restored, these light-emission control signals (EM_217-EM_220) sequentially switched back to active level and light-emission control signals(EM_218) are shifted downwards, for example, at the time when the display period restarts, according to the clock cycle of the second clock signal, EM_218 is generated and shifted downwards, and EM_217 first becomes active level, then EM_218-EM_220 also become active level in turn.

In this case, because both the gate driving signal and the light-emission control signal are suspended from shifting during the touch detection period, the preset timing relationship between them can still be satisfied, and thus driving abnormality will not be caused. However, during the touch detection period, the light-emission control signals which are already at inactive level when the touch detection period starts will maintain at inactive level, thus the pulse width of the inactive level pulse of each of these light-emission control signals will be extended, so the rows of pixels to which the light-emission control signals which are already at inactive level when the touch detection period starts are applied are suspended from emitting light for a longer period of time than the other rows of pixels to which the light-emission control signals which are not at inactive level when the touch detection period starts. As a result, some rows of pixels have a lower average luminance which leads to the display effect of un-uniform luminance. In this example, the 217-220th rows of pixels will have a darker luminance. Therefore, a horizontal section with a darker luminance will appear on the display panel. If the display frame is divided into a plurality of display periods and touch detection periods that are alternate, a plurality of horizontal sections with a darker luminance will appear on the display panel. This phenomenon can be verified by making the display panel output a solid color picture and measuring the first clock signal and the second clock signal, for example, suspending the output of the first clock signal and the second clock signal for a period of time (therefore, the shifted gate driving signals and the light-emission control signals will not be generated), and observing the dark lines of the horizontal stripes in these horizontal sections.

Figure 6A:
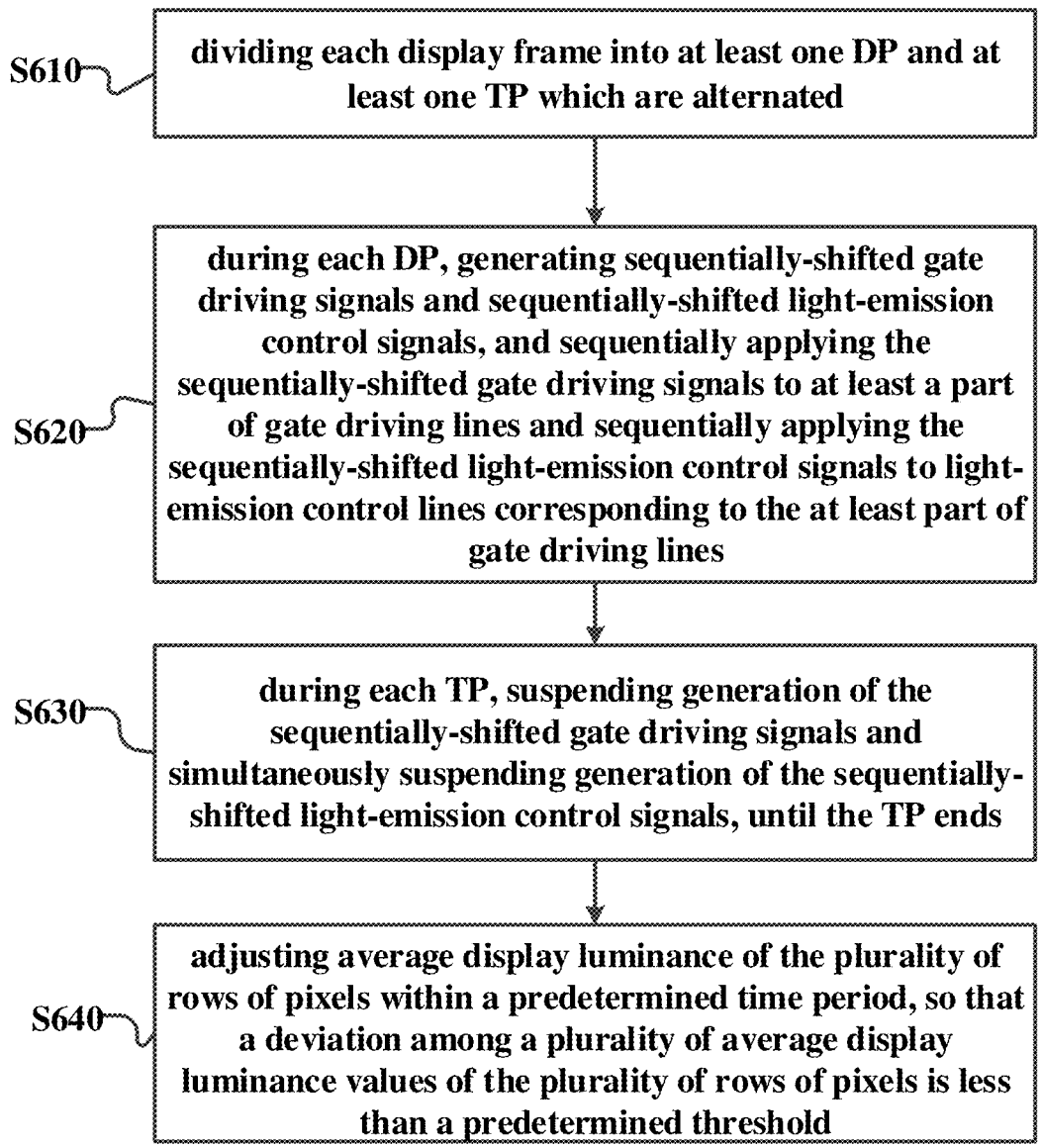

Therefore, the embodiment of the present disclosure further provides a method for driving the OLED touch-and-display panel. FIGS. 6A-6B show a flowchart of another method for driving the OLED touch-and-display panel according to an embodiment of the present disclosure.

As shown in FIG. 6A, in step S610, each display frame is divided into at least one display period and at least one touch detection period which are alternated.

At step S620, during each display period, sequentially-shifted gate driving signals and sequentially-shifted light-emission control signals are generated, the sequentially-shifted gate driving signals are sequentially applied to at least a part of gate driving lines, and the sequentially-shifted light-emission control signals are sequentially applied to light-emission control lines corresponding to the at least part of gate driving lines.

Steps S610-S620 are the same as steps S410 and S420 described with reference to FIG. 4A, so they will not be described in detail here.

At step S630, during each touch detection period, generation of the sequentially-shifted gate driving signals and generation of the sequentially-shifted light-emission control signals are simultaneously suspended, until the touch detection period ends.

That is to say, during the touch detection period, both the gate driving signal and the light-emission control signal are suspended from shifting, so that the preset timing relationship between the gate driving signal and the light-emission control signal for each row of pixels can still be satisfied, that is, for each row of pixels, during the period when the gate driving signal is of active level, the corresponding light-emission control signal is of inactive level.

In step S640, the average display luminance of the plurality of rows of the pixels is adjusted within a predetermined time period, so that the deviation among a plurality of average display luminance values of the plurality of rows of pixels is less than a predetermined threshold, wherein the average display luminance value of each row of pixels is related to the total light-emission time length of the row of pixels in the predetermined time period.

As described above with reference to FIG. 5, if no adjustment is made, the total light-emission time length of some rows of pixels will be shorter than that of other rows of pixels within a predetermined time period, so that the average display luminance of these rows of pixels will be darker than that of other rows of pixel, thus affecting the display effect of the display panel.

Therefore, the embodiment of the present disclosure proposes that the average display luminance of these rows of pixels can be adjusted so that the average display luminance of all rows of pixels is basically the same (the deviation is less than a predetermined threshold), thereby improving the display effect of the display panel.

In order to make the embodiments of this disclosure clearer and more perfect, and make its advantages more obvious, three specific exemplary adjustment methods will be described in detail with reference to FIGS. 6B-9. However, it should be understood by those skilled in the art that the following adjustment methods are only exemplary and not restrictive, as long as the average display luminance of all row of pixels is basically the same when the generation of the sequentially-shifted gate driving signals and the generation of the sequentially-shifted light-emission control signals are suspended in the case of time-division driving of display and touch detection.

The First Adjustment Method

The adjustment method in step S640 may include: when the predetermined period of time (a plurality of display frames) includes a plurality of touch detection periods, evenly distributing a plurality of rows of pixels of the display panel in the plurality of touch detection periods within the predetermined time period, so that the deviation among a plurality of total light-emission time lengths of the plurality of rows of pixels within the predetermined time period is less than a predetermined time length threshold.

That is to say, the pixel row(s) where the shift of the gate drive signal is suspended at the time when the touch detection period(s) starts in each display frame is continuously changed, that is, the shift of the gate driving signal is suspended at different pixel rows with respect to each display frame.

Figure 7A:
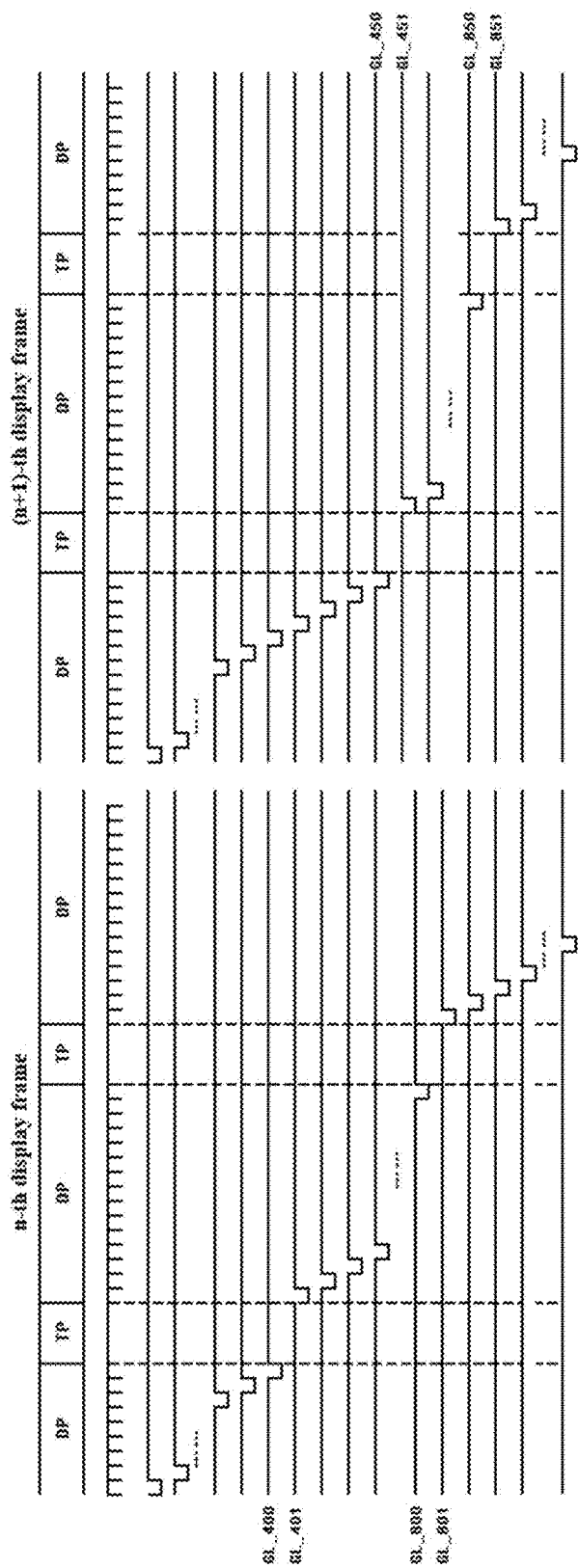
FIGS. 7A-7B show schematic diagrams of different pixel rows for entering a touch detection period and different time points for entering a touch detection period among a plurality of display frames according to an embodiment of the present disclosure.
Figure 7B:
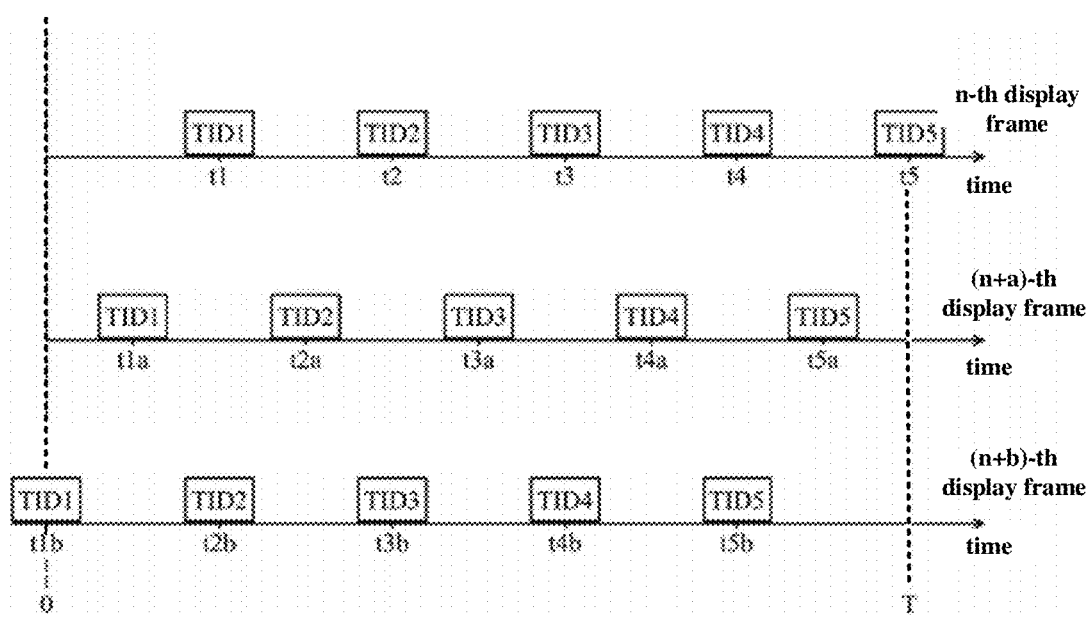

FIGS. 7A-7B show schematic diagrams of different pixel rows for entering a touch detection period and different time points for entering a touch detection period, among a plurality of display frames, according to an embodiment of the present disclosure.

For example, as shown in FIG. 7A, it is assumed that the number of pixel rows of the display panel is 1000, and one display frame includes 2 touch detection periods and 3 display periods which are alternated. In the n-th display frame, the shift of the gate driving signal is suspended at the 400th and 800th pixel rows respectively, and the shift continues from the 401st and 801st pixel rows respectively at the time when the two touch detection periods respectively end. In the (n+1)-th display frame, the shift of the gate driving signal may be suspended at the 450th line and the 850th pixel rows respectively, and the shift continues from the 451st pixel row and the 851st pixel row respectively at the time when the two touch detection periods respectively end.

In terms of time, as shown in FIG. 7B, it is assumed that during one display frame, there are five touch detection periods TID1, TID2, TID3, TID4 and TID5. The five touch detection periods TID1, TID2, TID3, TID4, and TID5 will start at the first group of time points t1, t2, t3, t4, and t5 in the n-th display frame (respectively corresponding to positions of the pixel rows where the shift of the gate driving signal is suspended); in the (n+a)-th display frame, they will start at the second group of time points t1a, t2a, t3a, t4a and t5a; in the (n+b)-th display frame, they will start at the third group of time points t1b, t2b, t3b, t4b and t5b. Because the time points where the touch detection periods of TID1, TID2, TID3, TID4 and TID5 start in respective display frames are different and staggered, the horizontal sections with dark lines can be evenly distributed to the display screen, which makes it difficult for human eyes to observe. The time points where the touch detection periods of TID1, TID2, TID3, TID4 and TID5 start in each display frame can be randomly selected.

With this adjustment method, by evenly distributing a plurality of rows of pixels of the display panel in the plurality of touch detection periods within the predetermined period (a plurality of display frames), the horizontal sections with dark lines caused by the suspending of the shift of light-emission control signal during the touch detection periods is evenly distributed to the whole display screen, and human eyes cannot observe the horizontal sections with dark lines.

The Second Adjustment Method

The adjustment method in step S640 may also include: within the predetermined time period, prohibiting the plurality of rows of pixels on the display panel from emitting light during the touch detection period, so that the deviation among a plurality of total light-emission time lengths of the plurality of rows of pixels within the predetermined period is less than a predetermined time length threshold.

Specifically, the plurality of rows of pixels on the display panel can be prohibited from emitting light during the touch detection period in the following manner: setting a global light-emission prohibition signal to active level during the touch detection period such that none of the plurality of rows of pixels emit light; and setting the global light-emission prohibition signal to inactive level at the end of the touch detection period, such that each row of pixels in the plurality of rows of pixels can emit light or not emit light according to the light-emission control signal applied to the light-emission control line corresponding to the row of pixels.

Figure 8:
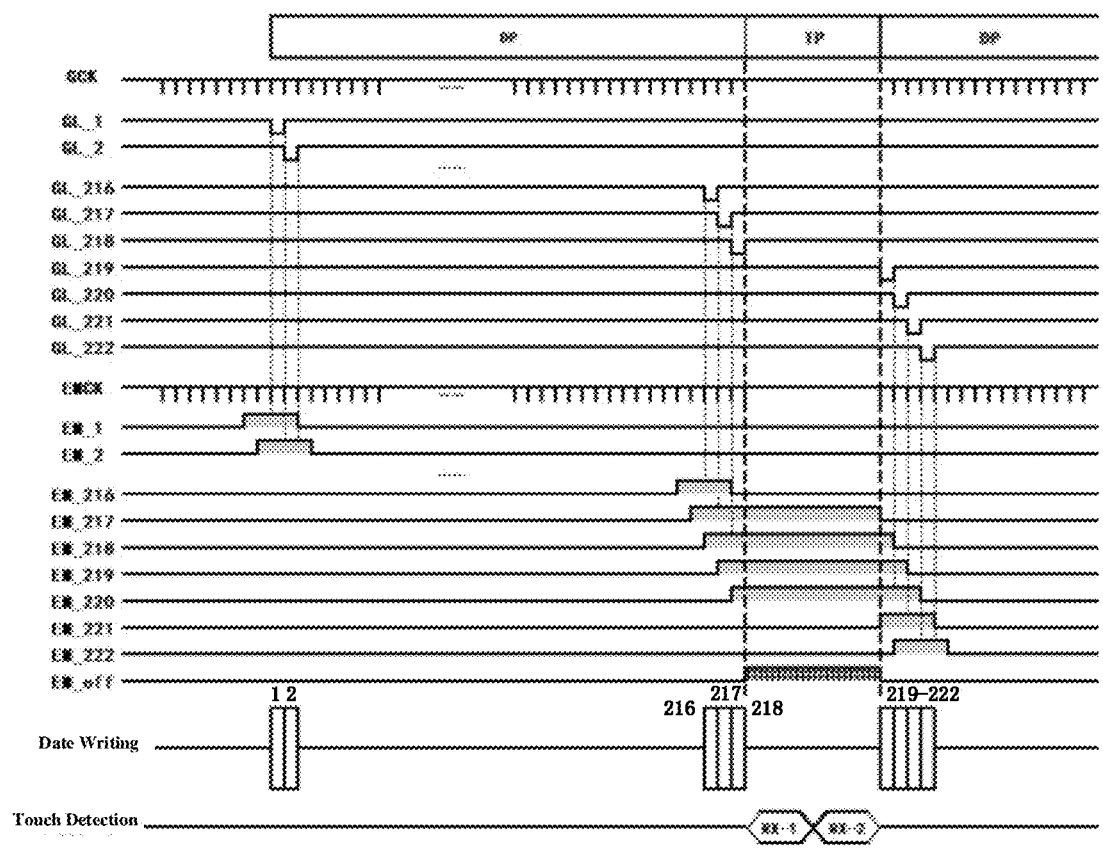
FIG. 8 shows a schematic timing diagram for adjusting the average display luminance of each row of pixels through an additional control signal according to an embodiment of the present disclosure.

FIG. 8 shows a schematic timing diagram for adjusting the average display luminance of each row of pixels through an additional control signal according to an embodiment of the present disclosure.

For example, as shown in FIG. 8, assuming that the predetermined time period is one display frame, the plurality of rows of pixels on the display panel are prohibited from emitting light during the touch detection period by an additional control signal, i.e., the global light-emission prohibition signal EM_off. It can be seen from FIG. 8 that during the touch detection period (TP), the global light-emission prohibition signal EM_off is set to active level (exemplified as high level in the FIG. 8), such that the plurality of rows of pixels do not emit light; and at the end of the touch detection period (TP), the global light-emission prohibition signal EM_off is set to inactive level (exemplified as low level in the FIG. 8), such that each row of pixels in the plurality of rows of pixels can emit light or not emit light according to the light-emission control signal applied to the light-emission control line corresponding to the row of pixels.

In addition, in the case that the plurality of rows of pixels on the display panel are prohibited from emitting light during the touch detection period based on the global light-emission prohibition signal, the adjustment method may specifically include: for each row of pixels, performing a logical operation on the global light-emission prohibition signal and the light-emission control signal applied to the light-emission control line corresponding to the row of pixels, to generate a final light-emission control signal for the row of pixels, and controlling the row of pixels to emit light or not using the final light-emission control signal; or, under the condition that the global light-emission prohibition signal is of active level, all rows of pixels are controlled not to emit light by using the global light-emission prohibition signal. In the former case, for example, i). an additional switching element may be connected in series with the switching element to which the light-emission control signal is provided in each pixel unit, or ii). an additional switching element may be connected in series between each light-emission control line and the light-emission control driver, and the global light-emission prohibition signal is connected to the control end of each additional switching element, so that for each pixel unit, it is equivalent to performing a logical AND operation on the global light-emission prohibition signal and the light-emission control signal to obtain a final light-emission control signal for controlling whether the pixel unit emits light or not.

With this adjustment method, by simply setting an additional control signal and additional switching elements, it is possible to make all rows of pixels not emit light during the touch detection period, so that the light-emission time lengths of respective rows of pixels are basically equal, thus basically having the same average display luminance.

The Third Adjustment Method

The adjustment method in step S640 may also include: in order to make the average display luminance of the plurality of rows of pixels approximately the same, adjusting display data for the rows of pixels corresponding to the horizontal section with dark lines, so that the average display luminance of the rows of pixels corresponding to the horizontal section with dark lines is approximately the same as the average display luminance of other rows of pixels.

Therefore, the adjustment method in step S640 may include the following sub-steps. For example, the predetermined time period is one display frame.

In step S640-1, the total time length of the display frame is determined.

It should be noted that the concepts related to the time length of the display frame mentioned in this disclosure all refer to the time length of the valid period of the display frame.

Optionally, there are one or more touch detection periods in each display frame. The determination process may specifically include: multiplying the time length of each touch detection period by the number of touch detection periods in the display frame to obtain the total time length of touch detection periods; multiplying the number of light-emission control lines by a clock cycle to obtain the original time length of the display frame; and adding the total time length of the touch detection periods to the original time length of the display frame to obtain the total time length of the display frame.

In step S640-2, the time length for which the light-emission control signal applied to each light-emission control line maintains at inactive level is determined.

Optionally, the determination process may specifically include: for each light-emission control line of at least one light-emission control line to which light-emission control signals which are at inactive level when each touch detection period starts are applied, determining the time length for which the light-emission control signal applied to the light-emission control line maintains at inactive level based on a reference time length for which the light-emission control signal maintains at inactive level and the time length of each touch detection period; and for each light-emission control line among other light-emission control lines, regarding the reference time length as the time length for which the light-emission control signal applied to the light-emission control line maintains at inactive level. The reference time length may be preset time length of the inactive level pulse of the light emission control signal, for example, four clock cycles as shown in the figures.

At step S640-3, display data for at least one row of pixels corresponding to at least one light-emission control line is adjusted according to a ratio, based on the time length for which the light-emission control signal applied to each light-emission control line maintains at inactive level and the total time length of the display frame, wherein light-emission control signals applied to the at least one light-emission control line are at inactive level when each touch detection period starts.

Optionally, the process may specifically include: for each light-emission control line of the at least one light-emission control lines, obtaining the time length for which the light-emission control signal applied to the light-emission control line maintains at active level as a first time length, based on the time length for which the light-emission control signal maintains at inactive level and the total time length of the display frame; for each light-emission control line among other light-emission control lines, obtaining the time length for which the light-emission control signal maintains at active level as a second time length based on the time length for which the light-emission control signal maintains at inactive level and the total time length of the display frame; determining the ratio based on the first time length and the second time length; and adjusting the display data for the at least one row of pixels corresponding to the at least one light-emission control line according to the ratio.

Figure 9:
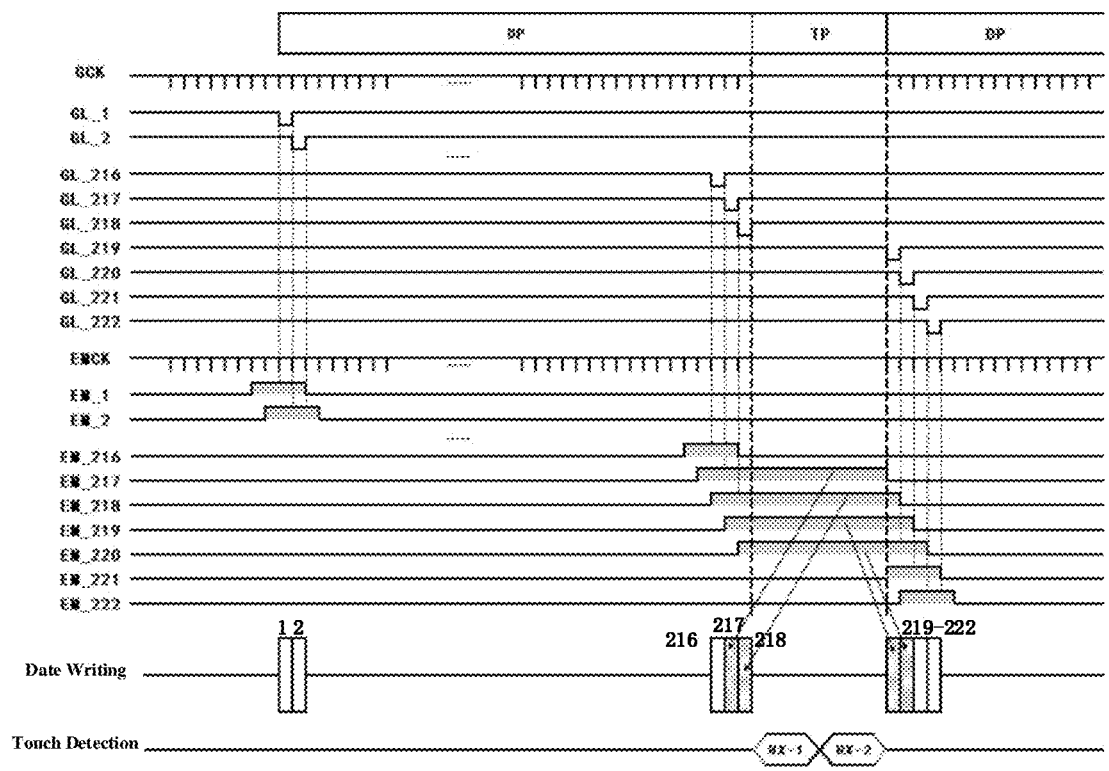
FIG. 9 shows a schematic timing diagram associated with adjusting display data for a part of rows of pixels according to an embodiment of the present disclosure.

FIG. 9 shows a schematic timing diagram associated with adjusting display data for a part of rows of pixels according to an embodiment of the present disclosure. In a specific example, it is assumed that the display panel has 2160 rows of pixels, the width of inactive level pulse of each light-emission control signal is 4 clock cycles (reference time length), the number of touch detection periods within a display frame is N1, and the time length of each touch detection period is equal to 100 clock cycles, therefore, as shown in FIG. 9, the pulse width of inactive level pulses of light emission control signals (e.g., EM_217 to EM_220) which are at inactive level when a certain touch detection period starts is extended to 100+4 clock cycles. In this case, the first ratio (R1) of the light-emission time length of the rows of pixels corresponding to the light-emission control lines to which these light-emission control signals are applied (i.e., the time length for which these light-emission control signals are at active level) relative to the total time length of the display frame is:

$$R1 = \frac{2160 + 100 \times N1 - 4 - 100}{2160 + 100 \times N1}$$

where N1 is the number of touch detection periods within one display frame. The second ratio (R2) of the light-emission time length of other rows of pixels relative to the time of the total time length of the display frame is:

$$R2 = \frac{2160 + 100 \times N1 - 4}{2160 + 100 \times N1}.$$

Therefore, in order that the average display luminance of all rows of pixels is basically the same, the display data for the rows of pixels with a shorter light-emission time length can be multiplied by the amplification ratio of R2/R1.

In addition, although in the above process, the average display luminance of the rows of pixels with a shorter light-emission time length is adjusted based on the display data, in practice, the above luminance adjustment method can also be used in combination with or instead of the background luminance adjustment method and other luminance adjustment functions of electronic products, and the average display luminance can be adjusted by adjusting data code, gamma codes and/or gamma voltages.

The algorithm for calculating the ratio for adjusting the display data can be preset, and as previously analyzed, this ratio is related to the number of touch detection periods within one display frame and the time length of inactive level of the light-emission control signal on each light-emission line. Because the configuration of touch detection periods and display periods is pre-configured, it is known which light-emission control signals (applied to light-emission control lines) are at inactive level when each touch detection period starts, so the original display data can be directly adjusted when setting the display data of these rows of pixels, and then the adjusted display data can be provided to these rows of pixels when data should be written into these rows of pixels (when the gate driving signals for these rows of pixels are at active level).

With the adjustment method, it is only necessary to adjust the display data for the rows of pixels whose average display luminance is darker due to the short light-emission time length in advance, so that the average display luminance of these rows of pixels is approximately the same as that of other rows of pixels.

The above three specific exemplary adjustment methods are described in detail respectively, but those skilled in the art should understand that these embodiments can be used independently or in combination, or other adjustment methods can be adopted, as long as the average display luminance of respective rows of pixels can be basically the same when the generation of the sequentially-shifted gate driving signals and the generation of the sequentially-shifted light-emission control signals are suspended, in a case where the display and touch detection are driven in a time-division manner.

In the embodiments described above with reference to FIGS. 5-9, the touch detection operation and display operation can be driven in a time-division manner, so that noise interference from display driving operation does not exist during touch detection operation, the touch detection operation does not take a long time, and therefore power can be saved. In addition, in the case where touch detection operation and display operation are driven in a time-division manner, there is no need to consider the timing and frequency of various signals related to display driving operation when selecting the frequency of the driving signal for touch detection operation, so there can be more selectable frequencies to combat other noise sources. In addition, for the horizontal sections with dark lines caused by suspending the generation of the sequentially-shifted gate driving signals and the generation of the sequentially-shifted light-emission control signals during the touch detection period, the display effect of the display panel can be improved by adjusting the average display luminance of respective rows of pixels to be uniform.

According to another aspect of the disclosure, a driving circuit is also disclosed, which can be used in a display panel in an OLED touch-and-display device. The driving circuit may include various drivers, such as the gate driver, the source driver and the light-emission control driver described above with reference to FIG. 1, and the driving circuit may also have a certain calculation processing function that, for example, the above-mentioned ratio for adjusting the display data may be calculated.

The driving circuit is designed to implement various methods as described above with reference to FIGS. 4A-9, so that the touch detection operation and display operation can be driven in a time-division manner, and the average display luminance of respective rows of pixels can be approximately the same, thereby making the display luminance of the display panel uniform, so as to improve the display effect.

According to another aspect of the disclosure, an OLED touch-and-display device is also disclosed. The OLED touch-and-display device may have substantially the same arrangement as that described with reference to FIG. 1. For example, an OLED touch-and-display device according to an embodiment of the present disclosure may include: a display panel including a plurality of rows of pixels, a plurality of gate driving lines (GL), and a plurality of light-emission control lines (EM) in one-to-one correspondence; a touch sensitive layer including a plurality of touch sensitive cells thereon; and a driving circuit, wherein the driving circuit can include various drivers, such as the gate driver, the source driver and the light-emission control driver described with reference to FIG. 1, and the driving circuit should also have a certain calculation processing function that, for example, the above-mentioned ratio for adjusting the display data may be calculated. That is, the driving circuit is designed to implement various methods as described above with reference to FIGS. 4A-9, so that the touch detection operation and display operation can be driven in a time-division manner, and the average display luminance of respective rows of pixels can be approximately the same, thereby making the display luminance of the display panel uniform, so as to improve the display effect.

That is to say, in the driving circuit and OLED touch-and-display device disclosed in the embodiment of the present disclosure, the touch detection operation and display operation can be driven in a time-division manner, so that noise interference from display driving operation does not exist during touch detection operation, the touch detection operation does not take a long time, and therefore power can be saved. In addition, in the case where touch detection operation and display operation are driven in a time-division manner, there is no need to consider the timing and frequency of various signals related to display driving operation when selecting the frequency of the driving signal for touch detection operation, so there can be more selectable frequencies to combat other noise sources. In addition, the average display luminance of respective rows of pixels can be approximately the same, thereby making the display luminance of the display panel uniform, so as to improve the display effect.

Although the present invention has been disclosed by way of examples, it is not intended to limit the present invention. Anyone with general knowledge in the technical field can make some changes and refinements without departing from the spirit and scope of the present invention. Therefore, the scope of protection of the present invention shall be determined as defined by the appended claims.

What is claimed is:

1. A method for driving an OLED touch-and-display device, the OLED touch-and-display device including a display panel including a plurality of rows of pixels, a plurality of gate driving lines (GL), and a plurality of light-emission control lines (EM) in one-to-one correspondence, the method comprising:

dividing each display frame into at least one display period and at least one touch detection period which are alternated;

during each display period, generating sequentially-shifted gate driving signals and sequentially-shifted light-emission control signals, and sequentially applying the sequentially-shifted gate driving signals to at least a part of gate driving lines of the plurality of gate driving lines and sequentially applying the sequentially-shifted light-emission control signals to light-emission control lines corresponding to the at least part of gate driving lines;

during each touch detection period, only suspending generation of the sequentially-shifted gate driving signals without suspending generation of the sequentially-shifted light-emission control signals, until the touch detection period ends; and adjusting average display luminance of the plurality of rows of pixels within a predetermined time period, so that a deviation among a plurality of average display luminance values of the plurality of rows of pixels is less than a predetermined threshold, and enabling a gate driving signal applied to a gate driving line corresponding to each row of pixels and a light-emission control signal applied to a light-emission control line corresponding to the row of pixels to satisfy a preset timing relationship, wherein an average display luminance value of each row of pixels is related to a total light-emission time length of the row of pixels within the predetermined time period.

2. The method according to claim 1, wherein the predetermined time period is one display frame, and each gate driving signal and each light-emission control signal are pulse signals, wherein, the step of "adjusting average display luminance of the plurality of rows of pixels within a predetermined time period, so that a deviation among a plurality of average display luminance values of the plurality of rows of pixels is less than a predetermined threshold, and enabling a gate driving signal applied to a gate driving line corresponding to each row of pixels and a light-emission control signal applied to a light-emission control line corresponding to the row of pixels to satisfy a preset timing relationship" comprises:

setting a number of inactive level pulses of a light-emission control signal applied to each light-emission control line within each display frame to a sum of 1 and a number of touch detection periods existing between display periods in the display frame, wherein a pulse width of each inactive level pulse is equal; and setting a time length between starting points of every two adjacent inactive level pulses within each display frame to be equal to a time length of one touch detection period.

3. The method according to claim 2, wherein in a case where a desired average display luminance of the display panel is determined, within the display frame, the pulse width of inactive level pulses of the light-emission control signal applied to each light-emission control line is related to the number of inactive level pulses, and the larger the number of inactive level pulses, the smaller the pulse width of inactive level pulses.

4. The method according to claim 1, wherein the sequentially-shifted gate driving signals and the sequentially-shifted light-emission control signals are generated in the following manner:

generating the sequentially-shifted gate driving signals based on a first clock signal (GCK), wherein a shift step of the gate driving signals is equal to clock cycle of the first clock signal;

generating the sequentially-shifted light-emission control signals based on a second clock signal (EMCK), wherein a shift step of the light-emission control signals is equal to clock period of the second clock signal, wherein, the first clock signal and the second clock signal have a same clock cycle, wherein, the preset timing relationship is that during a period when the gate driving signal applied to the gate driving line corresponding to each row of pixels is of active level, the light-emission control signal applied to the light-emission control line corresponding to the row of pixels is of inactive level.

5. The method according to claim 1, wherein each display frame is divided into a plurality of display periods and touch detection periods which are alternated, and the display frame sequentially comprises a first display period, a first touch detection period, a second display period and a second touch detection period, wherein, within the first display period, the sequentially-shifted gate driving signals for a first number of rows of pixels are generated;

wherein, within the second display period, the sequentially-shifted gate driving signals for a second number of rows of pixels are generated, wherein the second number of rows of pixels are immediately after the first number of rows of pixels.

6. A method for driving an OLED touch-and-display device, the OLED touch-and-display device including a display panel including a plurality of rows of pixels, a plurality of gate driving lines (GL), and a plurality of light-emission control lines (EM) in one-to-one correspondence, the method comprising:

dividing each display frame into at least one display period and at least one touch detection period which are alternated;

during each display period, generating sequentially-shifted gate driving signals and sequentially-shifted light-emission control signals, and sequentially applying the sequentially-shifted gate driving signals to at least a part of gate driving lines of the plurality of gate driving lines and sequentially applying the sequentially-shifted light-emission control signals to light-emission control lines corresponding to the at least part of gate driving lines;

during each touch detection period, suspending generation of the sequentially-shifted gate driving signals and simultaneously suspending generation of the sequentially-shifted light-emission control signals, until the touch detection period ends; and adjusting average display luminance of the plurality of rows of pixels within a predetermined time period, so that a deviation among a plurality of average display luminance values of the plurality of rows of pixels is less than a predetermined threshold, wherein the average display luminance value of each row of pixels is related to a total light-emission time length of the row of pixels within the predetermined time period.

7. The driving method according to claim 6, wherein the step of "adjusting average display luminance of the plurality of rows of pixels within a predetermined time period, so that a deviation among a plurality of average display luminance values of the plurality of rows of pixels is less than a predetermined threshold" comprises:

within the predetermined time period, evenly distributing the plurality of rows of pixels of the display panel in a plurality of touch detection periods, so that a deviation among a plurality of total light-emission time lengths of the plurality of rows of pixels within the predetermined time period is less than a predetermined time length threshold.

8. The method according to claim 6, wherein, the step of "adjusting average display luminance of the plurality of rows of pixels within a predetermined time period, so that a deviation among a plurality of average display luminance values of the plurality of rows of pixels is less than a predetermined threshold" comprises:

within the predetermined time period, prohibiting the plurality of rows of pixels from emitting light during the touch detection periods, so that the deviation among a plurality of total light-emission time lengths of the plurality of rows of pixels within the predetermined period is less than a predetermined time length threshold.

9. The method according to claim 8, wherein, the step of "prohibiting the plurality of rows of pixels from emitting light during the touch detection period" comprises:

setting a global light-emission prohibition signal to active level during the touch detection period, such that none of the plurality of rows of pixels emit light; and setting the global light-emission prohibition signal to inactive level at the end of the touch detection period, such that each row of pixels in the plurality of rows of pixels can emit light or not emit light according to the light-emission control signal applied to the light-emission control line corresponding to the row of pixels.

10. The method according to claim 9, further comprising:

for each row of pixels, performing a logical operation on the global light-emission prohibition signal and the light-emission control signal applied to the light-emission control line corresponding to the row of pixels, to generate a final light-emission control signal for the row of pixels, and controlling the row of pixels to emit light or not using the final light-emission control signal; or, in a case where the global light-emission prohibition signal is of active level, controlling all rows of pixels not to emit light by using the global light-emission prohibition signal.

11. The method according to claim 6, wherein the predetermined time period is one display frame, wherein, the step of "adjusting average display luminance of the plurality of rows of pixels within a predetermined time period, so that a deviation among a plurality of average display luminance values of the plurality of rows of pixels is less than a predetermined threshold" comprises:

determining a total time length of the display frame;

determining a time length for which a light-emission control signal applied to each light-emission control line maintains at inactive level; and adjusting display data for at least one row of pixels corresponding to at least one light-emission control line according to a ratio, based on the time length for which the light-emission control signal applied to each light-emission control line maintains at inactive level and the total time length of the display frame, wherein light-emission control signals applied to the at least one light-emission control line are at inactive level when each touch detection period starts.

12. The method according to claim 11, wherein the number of touch detection periods in the display frame is one or more, and the step of "determining the total time length of the display frame" comprises:

multiplying the time length of each touch detection period by the number of touch detection periods in the display frame, to obtain the total time length of touch detection periods;

multiplying a number of light-emission control lines by a clock cycle to obtain original time length of the display frame; and adding the total time length of the touch detection periods to the original time length of the display frame, to obtain the total time length of the display frame.

13. The method according to claim 12, wherein the step of "determining a time length for which the light-emission control signal applied to each light-emission control line maintains at inactive level" comprises:

for each light-emission control line of the at least one light-emission control line, determining the time length for which a light-emission control signal applied to the light-emission control line maintains at inactive level based on a reference time length for which the light-emission control signal maintains at inactive level and the total time length of touch detection periods; and for each light-emission control line among other light-emission control lines, regarding the reference time length as the time length for which the light-emission control signal applied to the light-emission control line maintains at inactive level.

14. The method according to claim 13, wherein the step of "adjusting display data for at least one row of pixels corresponding to at least one light-emission control line according to a ratio, based on the time length for which the light-emission control signal applied to each light-emission control line maintains at inactive level and the total time length of the display frame" comprises:

for each light-emission control line of the at least one light-emission control lines, obtaining the time length for which a light-emission control signal applied to the light-emission control line maintains at active level as a first time length, based on the time length for which the light-emission control signal maintains at inactive level and the total time length of the display frame;

for each light-emission control line among other light-emission control lines, obtaining the time length for which a light-emission control signal applied to the light-emission control line maintains at active level as a second time length based on the time length for which the light-emission control signal maintains at inactive level and the total time length of the display frame;

determining the ratio based on the first time length and the second time length; and adjusting the display data for the at least one row of pixels corresponding to the at least one light-emission control line according to the ratio.

15. A driving circuit, used in a display panel in an OLED touch-and-display device, wherein the display panel comprises a plurality of rows of pixels, a plurality of gate driving lines (GL) and a plurality of light-emission control lines (EM) in one-to-one correspondence, and the driving circuit is designed to execute the method according to claim 1.

16. A driving circuit, used in a display panel in an OLED touch-and-display device, wherein the display panel comprises a plurality of rows of pixels, a plurality of gate driving lines (GL) and a plurality of light-emission control lines (EM) in one-to-one correspondence, and the driving circuit is designed to execute the method according to claim 6.

17. An OLED touch-and-display device, comprising:
- a display panel including a plurality of rows of pixels, a plurality of gate driving lines (GL), and a plurality of light-emission control lines (EM) in one-to-one correspondence;
- a touch sensitive layer and a touch controller; and
- the driving circuit according to claim 15, which is used for driving the display panel.

18. An OLED touch-and-display device, comprising:
- a display panel including a plurality of rows of pixels, a plurality of gate driving lines (GL), and a plurality of light-emission control lines (EM) in one-to-one correspondence;
- a touch sensitive layer and a touch controller; and
- the driving circuit according to claim 16, which is used for driving the display panel.

* * * * *